(12) United States Patent
Magato

(10) Patent No.: US 9,576,080 B2
(45) Date of Patent: Feb. 21, 2017

(54) NODE CREATION WITH PHYSICAL MODELING

(71) Applicant: INTELLIGRATED HEADQUARTERS LLC, Mason, OH (US)

(72) Inventor: William A. Magato, Milford, OH (US)

(*) Notice: Subject to any disclaimer, the term of this patent is extended or adjusted under 35 U.S.C. 154(b) by 546 days.

(21) Appl. No.: 14/180,971

(22) Filed: Feb. 14, 2014

(65) Prior Publication Data
US 2015/0199452 A1 Jul. 16, 2015

Related U.S. Application Data

(60) Provisional application No. 61/928,209, filed on Jan. 16, 2014.

(51) Int. Cl.
*G06F 17/50* (2006.01)

(52) U.S. Cl.
CPC .................. *G06F 17/50* (2013.01)

(58) Field of Classification Search
CPC ........................................ G06F 17/50
See application file for complete search history.

(56) References Cited

U.S. PATENT DOCUMENTS

| | | | |
|---|---|---|---|
| 2005/0188348 A1* | 8/2005 | Han | G06T 19/00 717/105 |
| 2010/0077377 A1* | 3/2010 | Pegden | G06F 8/34 717/105 |
| 2012/0066662 A1* | 3/2012 | Chao | G06F 8/10 717/104 |

OTHER PUBLICATIONS

"Autodesk Factory Design Suite 2011 Learning Essentials," 2011, Autodesk, 553 pages.*
David Sinriech, "Network design models for discrete material flow systems: a literature review," 1995, Springer-Verlag, The International Journal of Advanced Manufacturing Technology, vol. 10, issue 4, pp. 277-291.*

* cited by examiner

*Primary Examiner* — Aniss Chad
*Assistant Examiner* — Russ Guill

(57) ABSTRACT

Systems, methods, and devices of the various embodiments enable valid links or nodes between pieces of material handling equipment to be identified based on a physical model of a material handling system in a facility. A model of a material handling system in a facility may indicate data associated with pieces of material handling equipment. Rules for each piece of material handling equipment may be applied to the data and used to identify infeed and/or discharge edges of the pieces of material handling equipment. Valid links between the pieces of material handling equipment may be identified based at least in part on the infeed and/or discharge edges.

20 Claims, 24 Drawing Sheets

1200

| VALID LINKS | | | |
|---|---|---|---|
| Link | Equipment ID | Type | Edge |
| A | 00001 | Accumulator Conveyor | Discharge |
| A | 00005 | Right Angle Transfer | Infeed 1 |
| B | 00005 | Right Angle Transfer | Discharge 3 |
| B | 00002 | Accumulator Conveyor | Infeed |
| ⋮ | ⋮ | ⋮ | ⋮ |

| UNASSOCIATED SIDES | | |
|---|---|---|
| Equipment ID | Type | Edge |
| 00001 | Accumulator Conveyor | Discharge |
| 00005 | Right Angle Transfer | Infeed 1 |
| 00005 | Right Angle Transfer | Discharge 3 |
| 00002 | Accumulator Conveyor | Infeed |
| ⋮ | ⋮ | ⋮ |

NODE CREATION WITH PHYSICAL MODELING

RELATED APPLICATIONS

This application claims the benefit of priority to U.S. Provisional Patent Application No. 61/928,209 entitled "Node Creation With Physical Modeling" filed Jan. 16, 2014, the entire contents of which is hereby incorporated by reference in its entirety.

BACKGROUND

Currently, material handling systems, such as material handling systems within distribution centers, are designed, modeled, and installed in a manual process. A designer selects the various material handling equipment, such as conveyors, rollers, etc., with which to move material within the distribution center, builds a design model of the selected material handling equipment indicating a type and location of material handling equipment in the distribution center and provides the model to installers who order, assemble, and install the selected material handling equipment in the distribution center according to the model. The model may be created using, for example, computer aided design ("CAD") software to create a two dimensional or three dimensional design model file. The current process for designing, modeling, and installing material handling systems relies heavily on the designer's ability to indicate the location and type of the material handling equipment correctly. Errors during the design phase in the placement of the material handling equipment and/or the type of material handling equipment in a model may result in numerous problems, such as material not flowing as intended in the installed material handling system, expensive in-field modifications to material handling equipment needing to be made during installation, ordering of the wrong material handling equipment, etc. Additionally, even if a design model is error free, design models do not indicate how material will actually move through a material handling system and do not identify the links (or nodes) between the material handling equipment in the material handling system.

SUMMARY

The systems, methods, and devices of the various embodiments enable valid links or nodes between pieces of material handling equipment to be identified based on a physical model of a material handling system within a facility. In an embodiment, a model of a material handling system within a facility may indicate data associated with pieces of material handling equipment for the facility. Rules for each piece of material handling equipment may be applied to the data and used to identify infeed and/or discharge edges of the pieces of material handling equipment in the facility model. In an embodiment, valid links between the pieces of material handling equipment may be identified based at least in part on the infeed and/or discharge edges. In a further embodiment, infeed and discharge edges not associated with a valid link may be indicated. In an embodiment, the physical model of the material handling system within a facility may be a computer aided design (CAD) file, and data associated with the pieces of material handling equipment may be an equipment identifier, equipment type indication, a center position, a floor length, and/or a floor width.

BRIEF DESCRIPTION OF THE DRAWINGS

The drawings and detailed description which follow are intended to be merely illustrative and are not intended to limit the scope of the invention as contemplated by the inventors:

FIG. 12A is a data structure diagram of an example listing of valid links between pieces of material handling equipment in a physical model of a material handling system.

FIG. 12B is a data structure diagram of an example listing of unassociated edges of pieces of material handling equipment in a physical model of a material handling system.

DETAILED DESCRIPTION

Figure 1A:
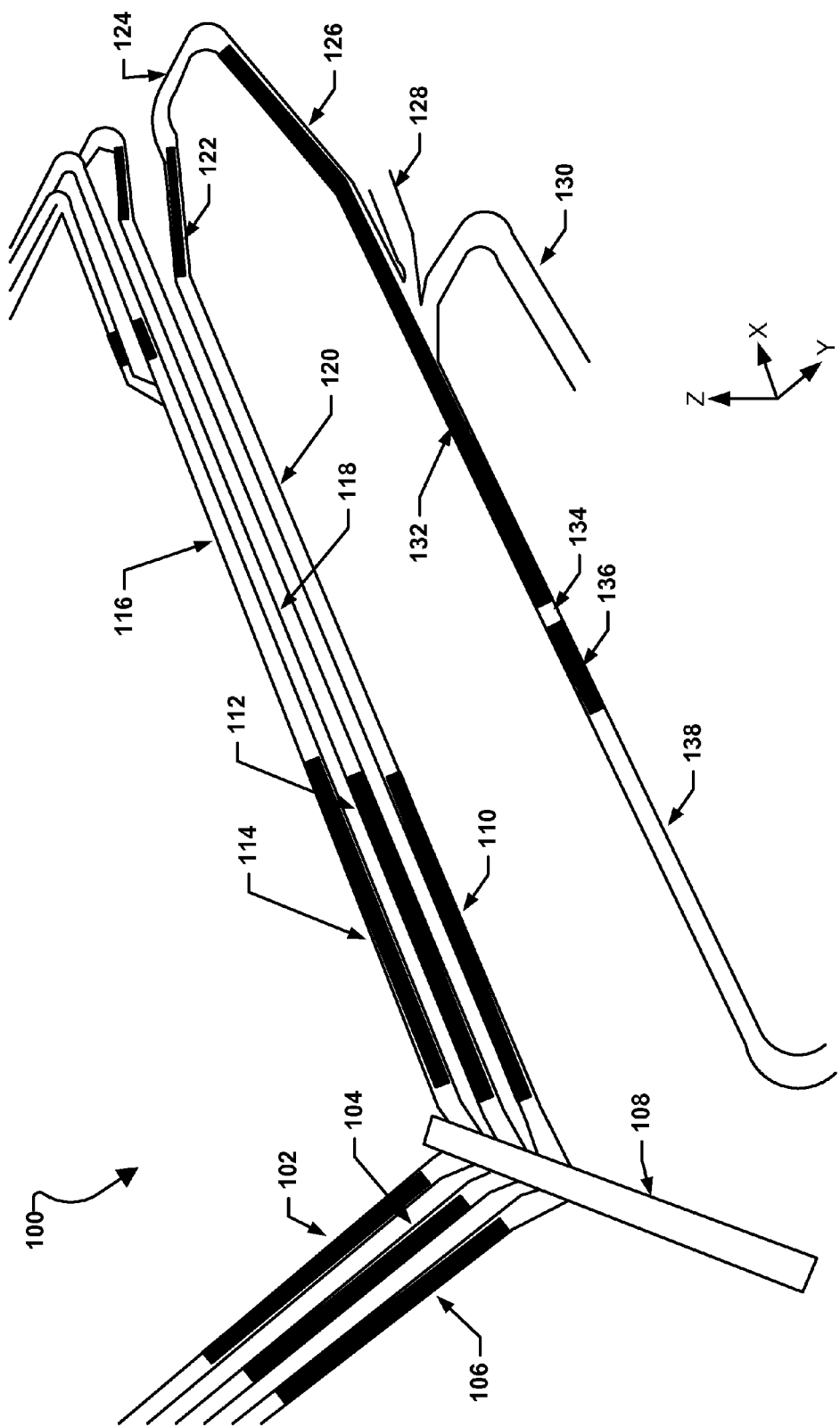
FIGS. 1A and 1B are a three dimensional view and a two dimensional view, respectively, of a physical model of a material handling system.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

As used herein, the term "piece of material handling equipment" is used to refer to a piece of motorized equipment that may be controlled to actively move material, such as material within a facility (e.g., a distribution center).

Examples, of pieces of material handling equipment include line conveyors, accumulation conveyors, motorized rollers, sorters, junction conveyors, right angle transfers, vertical belt conveyors, etc.

Pieces of material handling equipment and material handling systems are discussed herein as being located within a distribution center. The discussions of distribution centers are provided merely as examples to better illustrate the aspects of the various embodiments and are not intended to limit the various embodiments in any way. Other facilities, such as warehouses, factories, etc., may be used with the various embodiments, and other facilities, such as warehouses, factories, etc., may be substituted in the various examples without departing from the spirit or scope of the invention. Additionally, the models of material handling systems discussed herein may be models of a material handling system spanning an entire facility or may be models of an isolated material handling system and/or portion of a material handling system occupying less than the entire facility.

As used herein, the term "computing device" is used to refer to any one or all of desktop computers, personal data assistants (PDA's), laptop computers, tablet computers, smart books, palm-top computers, and similar electronic devices which include a programmable processor and memory and circuitry configured to provide the functionality described herein.

The various embodiments are described herein using the term "server." The term "server" is used to refer to any computing device capable of functioning as a server, such as a master exchange server, web server, mail server, document server, or any other type of server. A server may be a dedicated computing device or a computing device including a server module (e.g., running an application which may cause the computing device to operate as a server). A server module (e.g., server application) may be a full function server module, or a light or secondary server module (e.g., light or secondary server application) that is configured to provide synchronization services among the dynamic databases on computing devices. A light server or secondary server may be a slimmed-down version of server type functionality that can be implemented on a computing device, such as laptop computer, thereby enabling it to function as a server (e.g., an enterprise e-mail server) only to the extent necessary to provide the functionality described herein.

The systems, methods, and devices of the various embodiments enable valid links (or nodes) between pieces of material handling equipment to be identified based on a physical model of a material handling system within a facility, such as a distribution center. In an embodiment, a model of a material handling system may indicate data associated with pieces of material handling equipment. Rules associated with the pieces of material handling equipment may be applied to the data indicated in the model and used to identify infeed and/or discharge edges of the pieces of material handling equipment in the model of the material handling system. In an embodiment, valid links between the pieces of material handling equipment may be identified based at least in part on the infeed and/or discharge edges.

In an embodiment, the model of the material handling system within the facility, such as a distribution center or other area including material handling equipment, may be a computer aided design (CAD) file. The model of the material handling system within the facility may be a model of a material handling system spanning the entire facility or may be a model of an isolated material handling system and/or portion of a material handling system occupying less than the entire facility. The data associated with the pieces of material handling equipment may be an equipment identifier, equipment type indication, a center position, an orientation, a floor length, and/or a floor width. In an embodiment, a link creation application running on a processor of a computing device may receive the CAD file and parse the CAD file to generate a listing of all pieces of material handling equipment. In an embodiment, the listing of all pieces of material handling equipment may be an XML file. The link creation application running on the processor of the computing device may also apply rules for each piece of material handling equipment to determine its respective infeed and discharge edges. The link creation application may also generate a listing of the determined infeed and discharge edges. The applied rules may be based on the equipment type indication for each piece of material handling equipment in the listing, its center position, floor length, and/or floor width. The listing of the determined infeed and discharge edges may be the same file discussed above listing all pieces of material handling equipment or may be a new file. For example, the listing may be a new XML file listing the determined infeed and discharge edges for each piece of material handling equipment.

In an embodiment, the valid links (or nodes) between pieces of material handling equipment may be identified based on the generated listing of the determined infeed and discharge edges. Valid links (or nodes) may be a pairing of an infeed edge for a particular piece of material handling equipment and a discharge edge of another piece of material handling equipment that meet one or more requirements. These requirements may include being separated by a distance less than or equal to a tolerance, being parallel to each other, being aligned with each other, being at the same height, etc. In an embodiment, attributes of the infeed edges and discharge edges of the various pieces of material handling equipment may be determined based on the data associated with the pieces of material handling equipment from the physical model of the material handling system of the facility. In addition, the attributes may be determined based on the rules based on the equipment type indication for each piece of material handling equipment. The attributes of the infeed edges and discharge edges may be used to determine whether an infeed edge of one piece of material handling equipment and a discharge edge of another piece of material handling equipment meet one or more requirements. If the one or more requirements are met, then the proposed node (link) may be identified as a valid link (or node). By identifying valid links (or nodes) the various embodiments may enable a model of the valid links (or nodes), such as a graph of links (or nodes), to be generated indicating how material may actually move through the material handling system.

In a further embodiment, infeed and discharge edges not associated with a valid link (or node) may be identified and an indication of the identified infeed and discharge edges may be generated. For example, a listing of infeed or discharge edges that are not part of a valid link (or node) may be generated. In this manner, errors in placement of the pieces of material handling equipment and/or the type of material handling equipment in a physical model may be identified prior to the installation. By identifying potential errors prior to the actual build out of a material handling system, such as a material handling system for a distribution center, significant cost and time savings associated with in-field modifications to material handling equipment, replacement orders, etc. may be achieved.

Figure 1B:
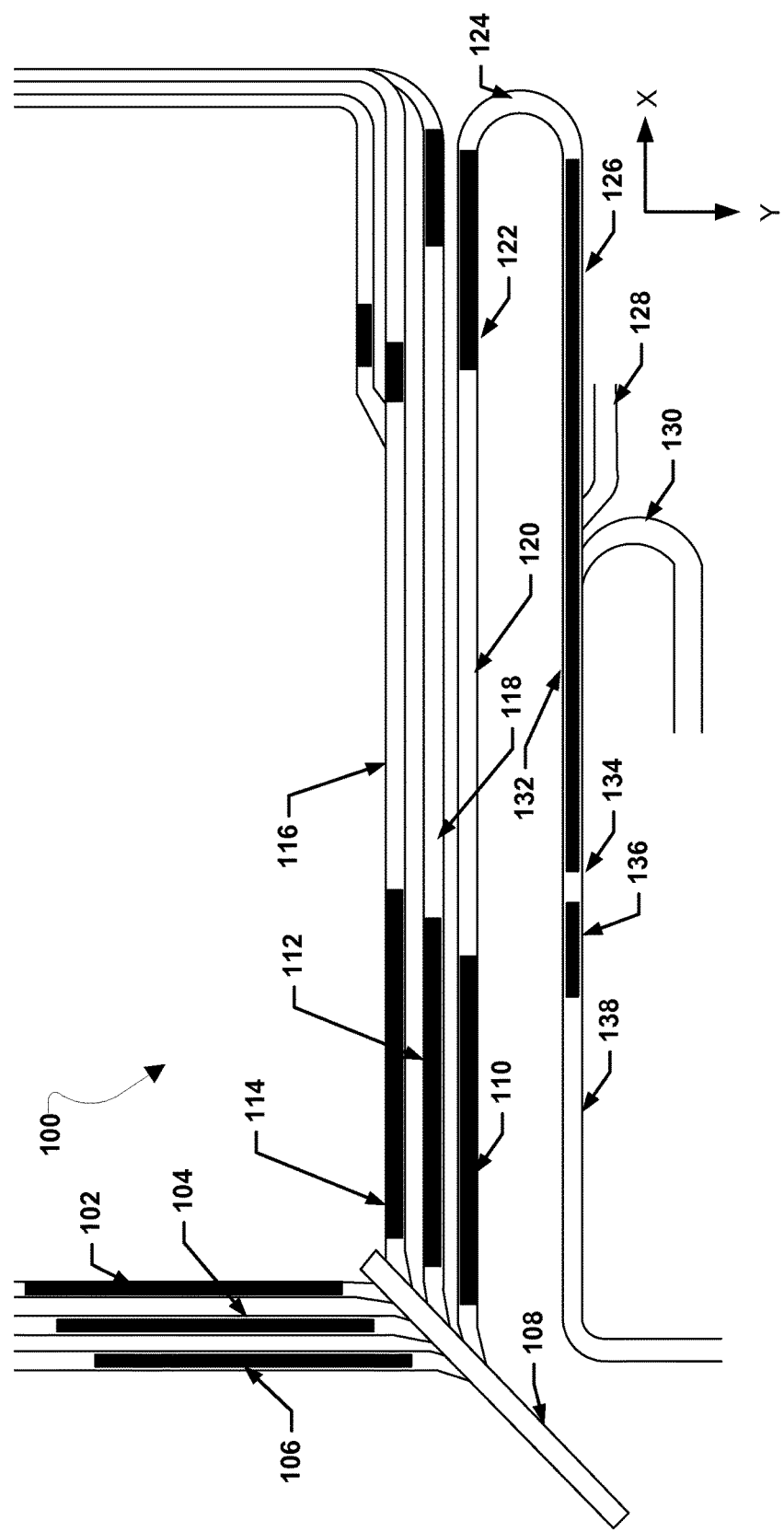

FIG. 1A is a three dimensional view a physical model 100 of a portion of a distribution center. FIG. 1B is a two dimensional view a physical model 100 of a portion of a distribution center. FIG. 1A illustrates various pieces of material handling equipment and their relationships in the x, y, and z directions and FIG. 1B illustrates the same pieces of material handling equipment in the x and y direction. As an example, the physical model 100 of the portion of the distribution center may be a CAD file. The physical model 100 may include data associated with motorized rollers 102, 104, and 106, junction conveyor 108, motorized rollers 110, 112, and 114, line conveyors 116, 118, and 120, motorized roller 122, conveyor 124, vertical belt conveyor 126, motorized rollers 128 and 130, motorized rollers 134, and 136, and conveyor 138. The data may include an equipment identifier, equipment type indication, a center position, an orientation, a floor length, and a floor width for each piece of material handling equipment 102, 104, 106, 108, 110, 112, 114, 116, 118, 120, 122, 124, 126, 128, 130, 134, 136, and 138.

Figure 2A:
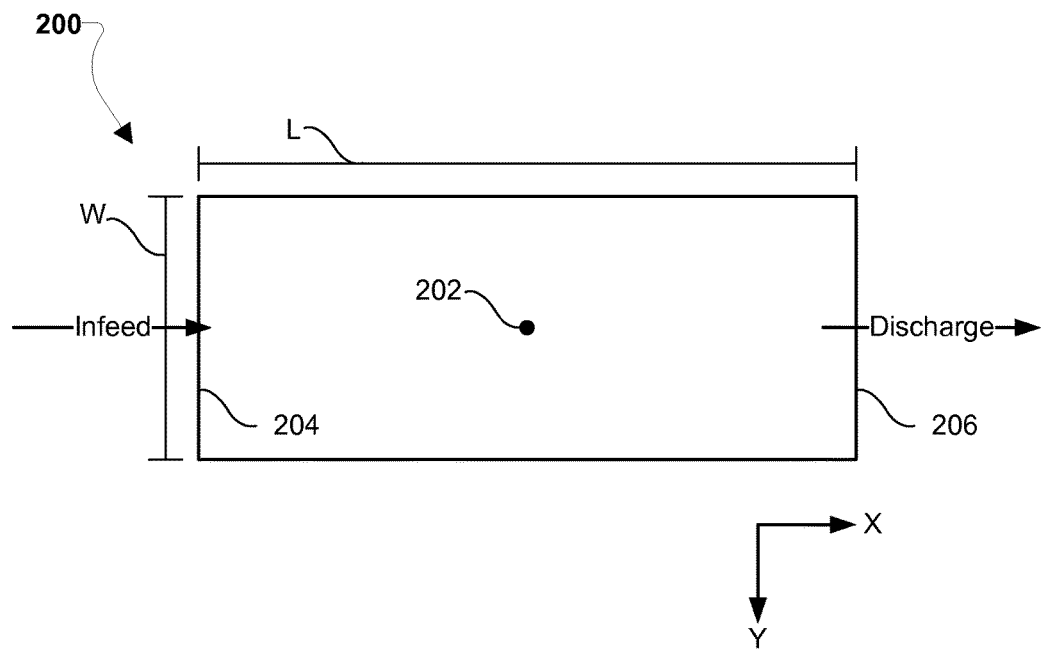
FIGS. 2A and 2B are block diagrams of different views of an example piece of material handling equipment.
Figure 2B:
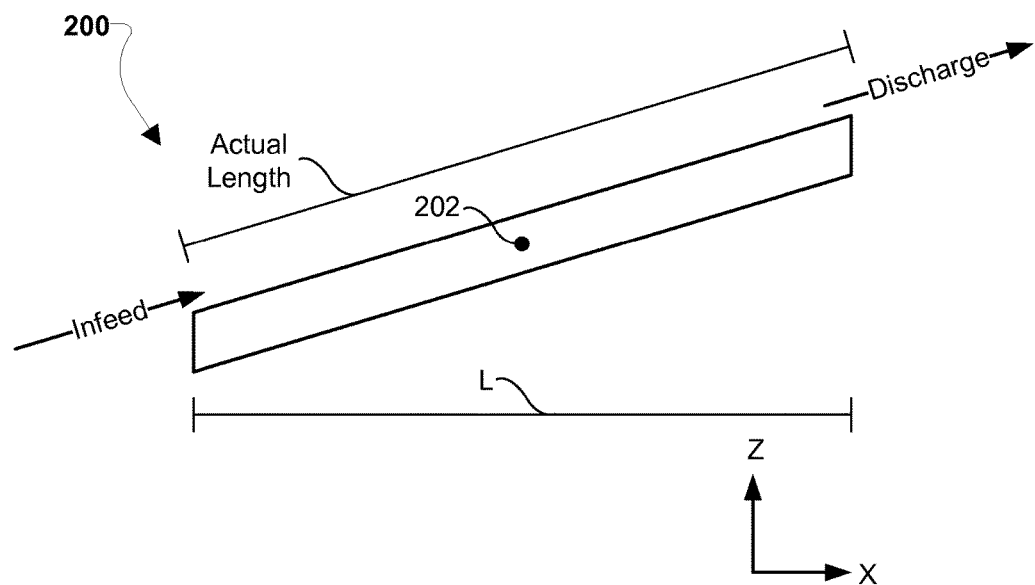

FIGS. 2A and 2B are block diagrams of different views of an example piece of material handling equipment 200, such as a line conveyor. FIGS. 2A and 2B illustrate the difference between an actual length of the piece of material handling equipment 200 and a floor length L of the piece of material handling equipment 200. FIG. 2A illustrates a two dimensional view of the piece of material handling equipment 200 viewed from overhead down a z axis. An infeed edge 204 of the piece of material handling equipment 200 may be the side (or edge) at which material is intended to enter the piece of material handling equipment 200. A discharge edge 206 may be the side (or edge) at which material is intended to exit the piece of material handling equipment 200. The material handling equipment 200 may also have a center point 202. The piece of material handling equipment 200 may have a floor length L running along the x axis and a floor width W running along the y axis. The floor length L and floor width W may be the length and width covered across a distribution center floor in a single plane. Additionally, the orientation may be a measurement in degrees indicating how the piece of material handling equipment 200 is oriented in the material handling system, such as a measurement in degrees clockwise from the x axis around the z axis. As another example, orientations may be degree measurements from cardinal headings, such as 20 degrees off of North, etc. In an embodiment, the floor length L, floor width W, orientation, and center point 202 may be data indicated in a physical model of the material handling system in the facility, such as a CAD file.

FIG. 2B illustrates the difference between the actual length of the piece of material handling equipment 200 and the floor length L. FIG. 2B illustrates the two dimensional view of the material handling equipment 200 viewed down the y axis. As illustrated in FIG. 2B, the piece of material handling equipment 200 may extend vertically along the z axis, such that the piece of material handling equipment 200 is not actually flat across the distribution center floor in a single plane. Thus, the actual length (i.e., hypotenuse) may be greater than the floor length L. In the various embodiments, when a physical model of a material handling system is received in which the actual length or actual width does not correspond to the floor length L or floor width W of the piece of material handling equipment, the actual length and/or actual width of the piece of material handling equipment may be used to determine the floor length L and/or floor width W of the piece of material handling equipment. For example, a simple geometry calculation using the Pythagorean theorem may be used to determine the floor length. The determined floor length L and/or floor width W of the piece of material handling equipment may then be used to generate the listing of infeed and discharge edges, identify valid links, and/or identify infeed and/or discharge edges not associated with a valid link.

Figure 3:
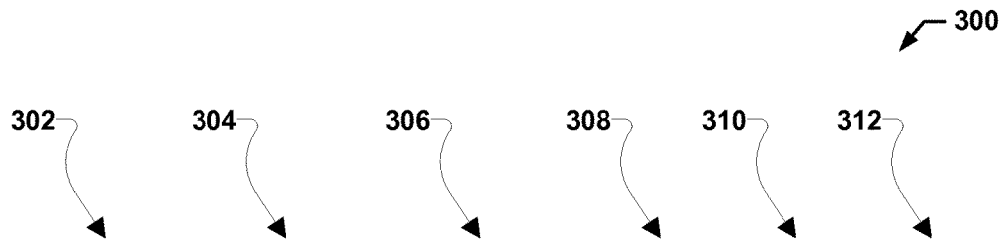
FIG. 3 is a data structure diagram of an example listing of pieces of material handling equipment in a physical model of a material handling system.

FIG. 3 is a data structure diagram of an example listing 300 of pieces of material handling equipment in a physical model of a material handling system. In an embodiment, a link creation application running on a processor of a computing device may receive a physical model of a material handling system in a facility, such as a CAD file, and generate the listing 300 based at least in part on the physical model of the material handling system. For example, the listing may be generated by parsing a CAD file. In an embodiment, the listing 300 may be an XML file, such as an AutoCAD XML export file.

The listing 300 may indicate an equipment ID 302 for each piece of equipment in the model of the material handling system. As an example, an equipment ID 302 may be a five digit number uniquely identifying each piece of material handling equipment in the model of the material handling system. The listing 300 may indicate an equipment type 304. The listing 300 may indicate a center position 306 of each piece of material handling equipment in the model of the material handling system. In an embodiment, the center position 306 may be an x, y, and z axis coordinate identifying the location of the center of the piece of material handling equipment in the model of the material handling system. The listing 300 may indicate a floor length 308 and a floor width 310 of each piece of material handling equipment in the model of the material handling system. As discussed above, floor length 308 and floor width 310 for each piece of material handling equipment may be in the same plane and may not correspond to the piece of material handling equipment's actual length or width. The listing 300 may indicate an orientation 312 of each piece of material handling equipment in the model of the material handling system. The orientation 312 may be an indication in degrees identifying how each piece of material handling equipment is oriented in the material handling system. As an example, orientation may be a measurement in degrees clockwise from the x axis around the z axis. As another example, orientation may be degree measurements from cardinal headings, such as 20 degrees off of North, etc. The orientation may enable the exact locations of edges of pieces of material handling equipment to be determined. Indicating how a piece of material handling equipment is rotated about the z-axis (e.g., its orientation) in addition to the piece of material handling equipment's x, y, and z location may enable rules based on the equipment type to define the location of the edges and geometry of the material handling equipment without needing all three of the pitch, yaw, and roll information for the piece of material handling equipment. In an embodiment, using rules based on the equipment type 304, such as configuration rules, and center position 306, orientation 312, floor length 308, and/or floor width 310, infeed and/or discharge edges of each piece of material handling equipment may be identified and the attributes of those infeed and/or discharge edges may be calculated, such as height of an infeed and/or discharge edge, length of an infeed and/or discharge edge, a center line of an infeed and/or discharge edge, an edge line of an infeed and/or discharge edge, an orientation of an infeed and/or discharge edge, etc.

Figure 4:
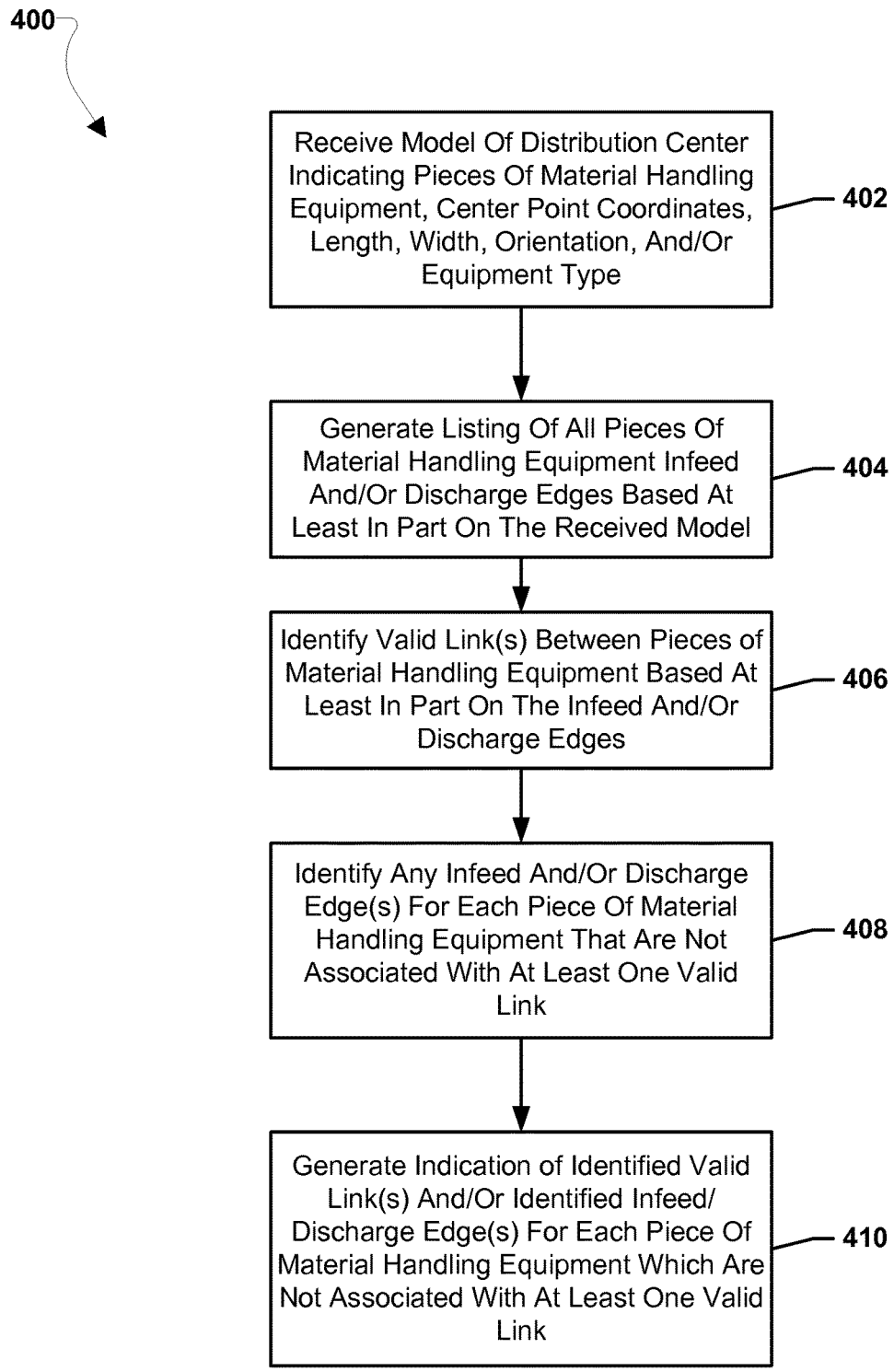
FIG. 4 is a process flow diagram illustrating an embodiment method for generating an indication of valid links between pieces of material handling equipment and generating an indication of infeed edges and discharge edges of material handling equipment not associated with a valid link.

FIG. 4 illustrates an embodiment method 400 for generating an indication of valid links between pieces of material handling equipment as well as an indication of infeed edges and discharge edges of material handling equipment not associated with a valid link based on a physical model of a material handling system of a facility. In an embodiment, the operations of method 400 may be performed by a processor, such as a processor of a computing device or server running a link creation application.

In block 402 the processor may receive a model of the material handling system indicating pieces of material handling equipment within the distribution center, the center points of the pieces of material handling equipment, orientation of the pieces of material handling equipment, lengths (actual or floor length) of the pieces of material handling equipment, widths lengths (actual or floor width) of the pieces of material handling equipment, and/or equipment types for each piece of material handling equipment. As an example, the model of the material handling system may be a CAD file indicating data associated with each piece of material handling equipment. This data may include, for example, an equipment ID, equipment type, center position, orientation, floor length, and/or floor width.

In block 404 the processor may generate a listing of all infeed and discharge edges for each piece of material handling equipment based at least in part on the received model. As an example, the processor may identify the equipment type of each piece of material handling equipment and based on rules associated with each equipment type may determine the infeed and discharge edges of each piece of material handling equipment. The rules associated with each piece of equipment may include, for example, rules specifying the behavior of equipment based on equipment type, In block 406 the processor may identify one or more valid links between the pieces of material handling equipment in the listing based at least in part on the infeed and discharge edges. Valid links (or nodes) may be a pairing of an infeed edge of one piece of material handling equipment and a discharge edge of another piece of material handling equipment that meet one or more requirements, such as being separated by a distance less than or equal to a tolerance, being parallel to each other, being aligned with each other, being at the same height, etc. The processor may test each infeed edge and discharge edge against the one or more requirements to identify valid links.

In block 408 the processor may identify any infeed and/or discharge edges for each piece of material handling equipment that are not associated with at least one valid link. As an example, as valid links are identified the infeed and discharge edges associated with the valid link may be removed from the listing. When no more valid links can be identified that meet the requirements, any remaining infeed or discharge edges on the listing may be identified as not associated with at least one valid link. In block 410 the processor may generate an indication of the identified valid links and/or may generate an indication of identified infeed and discharge edges for each piece of material handling equipment which are not associated with at least one valid link. For example, the processor may generate a listing of valid links between pieces of material handling equipment and a listing of unassociated edges of pieces of material handling equipment. As another example, the processor may generate combined listing of valid links and unassociated edges.

FIGS. 5A-5I illustrate another embodiment method 500 for generating an indication of valid links between pieces of material handling equipment and/or infeed edges and discharge edges of material handling equipment not associated with a valid link based on a physical model of a material handling system. In an embodiment, the operations of method 500 may be performed by a processor, such as a processor of a computing device or server running a link creation application.

As discussed above, in block 404 the processor may generate a listing of all pieces of material handling equipment based at least in part on the received model. In block 502 the processor may identify infeed and/or discharge edges for each piece of material handling equipment in the listing based at least in part on equipment type rules. Equipment type rules may be rules specifying the behavior of pieces of material handling equipment based on equipment type. For example, equipment rules may specify the type of infeed or discharge edge for a piece of material handling equipment (e.g., an infinite infeed or discharge edge for a junction conveyor), a number of infeed or discharge edges for a piece of material handling equipment, an orientation of the infeed or discharge edges for a piece of material handling equipment, the height of infeed or discharge edges for a piece of material handling equipment, etc. Equipment type rules for one type of material handling equipment, such as a sorter, may be different than equipment type rules for another type of material handling equipment, such as a conveyor.

Figure 6:
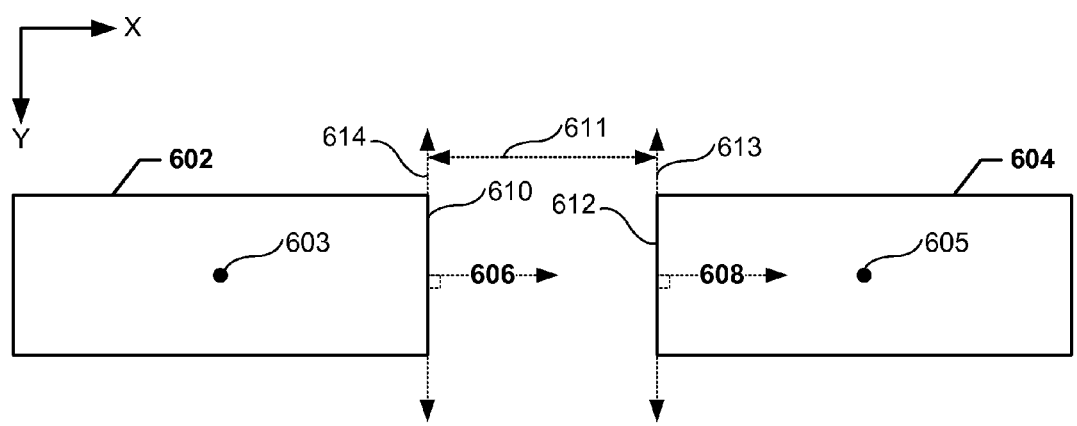
FIGS. 6-9 are block diagrams illustrating relationships between infeed and discharge edges of pieces of material handling equipment in a physical model of a material handling system.

In block 504 the processor may calculate the discharge edge center lines and infeed edge center lines for each piece of material handling equipment. FIG. 6 illustrates an example discharge center line 606 extending perpendicularly from the discharge edge 610 of a conveyor 602 with a center point 603. A conveyor 604 may have a center point 605 and infeed edge 612, and an infeed center line 608 may extend perpendicularly from the infeed edge 612. The discharge center line 606 and infeed center line 608 may be calculated as an equation of a line for each conveyor 602, 604 based on the data associated with each conveyor 602, 604 in the model of the material handling system.

Figure 5A:
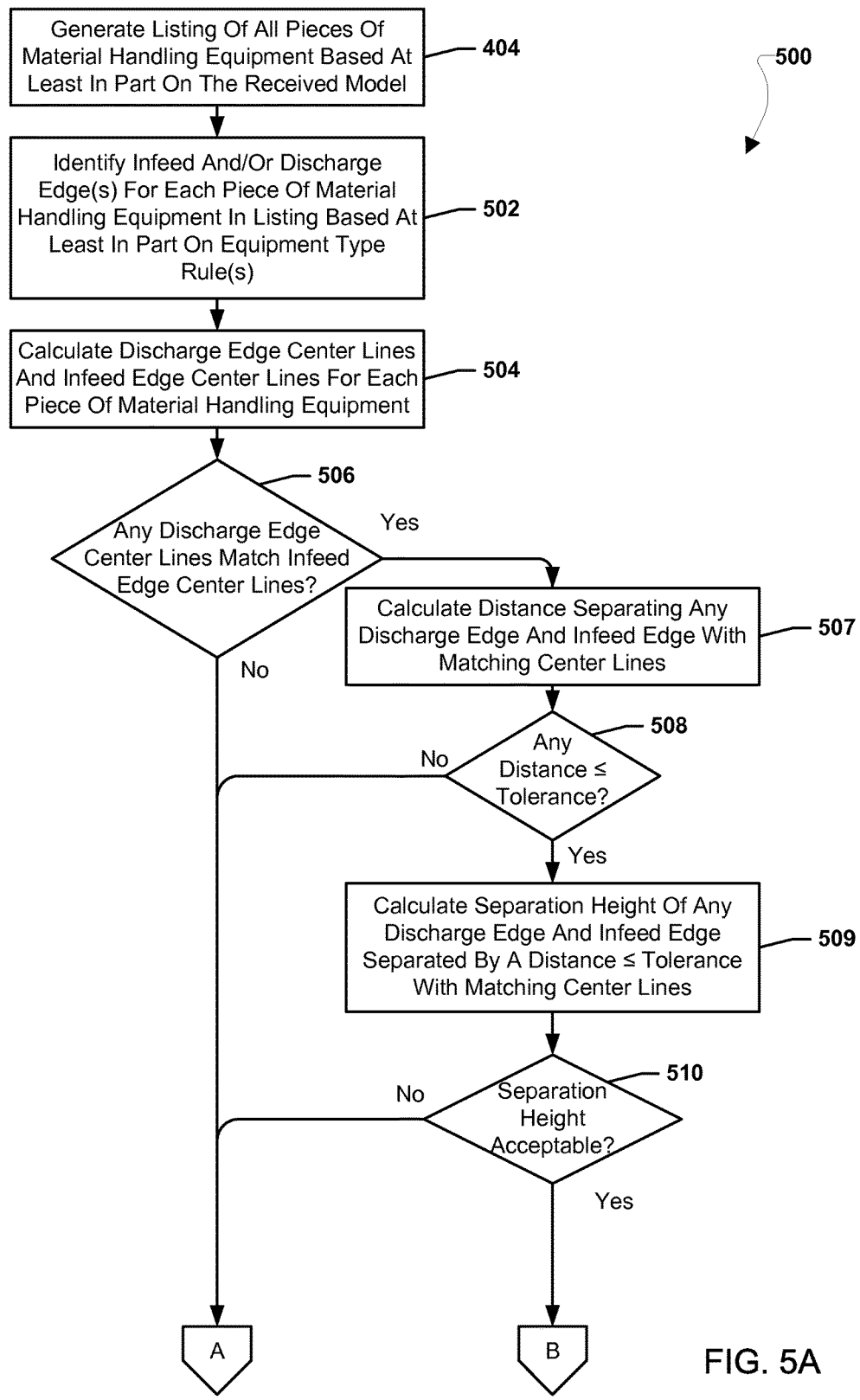
FIGS. 5A-5I are a process flow diagram illustrating another embodiment method for generating an indication of valid links between pieces of material handling equipment and generating an indication of infeed edges and discharge edges of material handling equipment not associated with a valid link.

Returning to FIG. 5A, in determination block 506 the processor may determine whether any discharge edge center lines match infeed edge center lines. As an example, the processor may determine whether any two pieces of material handling equipment have the infeed edge center line equations that are the same as a discharge edge center line equation. If any discharge edge center lines match (i.e., determination block 506="Yes"), in block 507 the processor may calculate a distance separating any discharge edge and infeed edge with matching center lines. Referring to FIG. 6, the distance 611 separating two pieces of material handling equipment 602 and 604 may be the distance 611 between discharge edge 610 and infeed edge 612. Referring to FIG. 5A, in determination block 508 the processor may determine whether any distance separating any discharge edge and infeed edge with matching center lines is less than or equal to a tolerance. For example, the tolerance may be a quarter of an inch. If the distance is less than or equal to the tolerance (i.e., determination block 508="Yes"), in block 509 the processor may calculate a separation height of any discharge edge and infeed edge separated by less than or equal to the tolerance with matching center lines. As an example, the processor may calculate a separation height by calculating the height of the discharge edge and infeed edge and subtracting the height of the infeed edge from the height of the discharge edge.

Figure 5B:
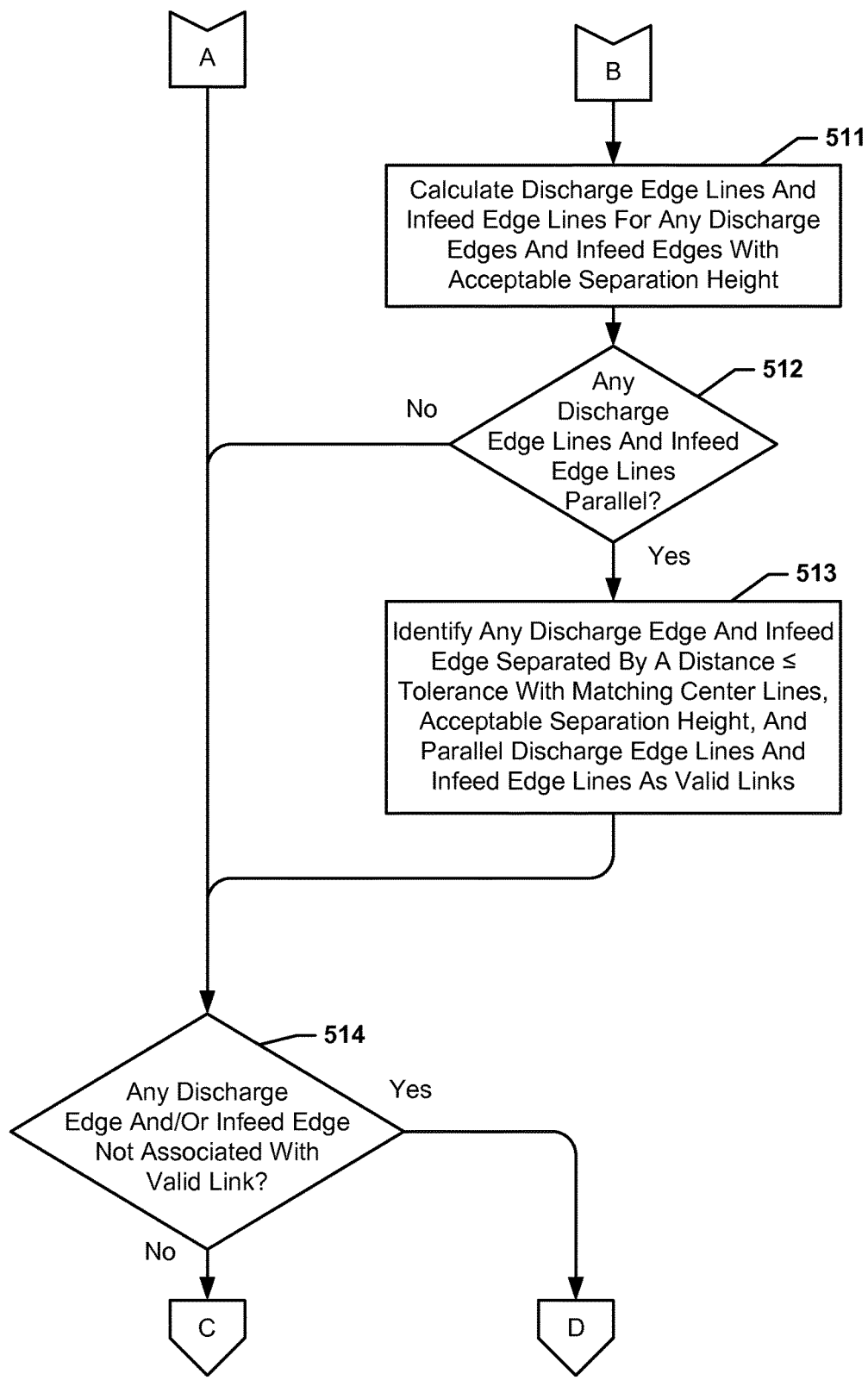

In determination block 510 the processor may determine whether the separation height is acceptable. In an embodiment, a separation height may be acceptable when the infeed edge is at an equal height with the discharge edge (e.g., "0 inches" separation height) or below the infeed edge by no more than a selected margin (e.g., "2.0 inches" separation height). In this manner, an infeed edge that is above a discharge edge and would result in material being stopped may be identified by an unacceptable separation height (e.g., a negative separation height) as well as a discharge edge too far above an infeed edge (e.g., by more than the selected margin, such as a maximum acceptable drop distance for the material being moved by the equipment to prevent damage). Referring to FIG. 5B, if the separation height is acceptable (i.e., determination block 510="Yes"), in block 511 the processor may calculate the discharge edge lines and infeed edge lines for any discharge edges and infeed edges with acceptable separation heights. Referring to FIG. 6, the infeed edge line 613 of conveyor 604 and the discharge edge line 614 of conveyor 602 may be calculated as equations of lines running along the infeed edge and discharge edge of the conveyors 602 and 604, respectively, based on the data associated with each conveyor 602, 604 in the model of the material handling system.

Returning to FIG. 5B, in determination block 512 the processor may determine whether any discharge edge lines and infeed edge lines are parallel. For example, the processor may compare the calculated equations of the lines of the infeed and discharge edges of the pieces of material handling equipment to each other to determine whether the lines have matching slopes. If any discharge edge lines and infeed edge lines are parallel (i.e., determination block 512="Yes"), in block 513 the processor may identify any discharge edge and infeed edge separated by less than or equal to the tolerance with matching center lines, acceptable separation height, and parallel discharge edge lines and infeed edge lines as valid links. In an embodiment, the calculation of center lines, separation distances, and height may identify seventy five percent of the valid links in a model of a material handling system, thereby reducing the set of unmatched infeed or discharge edges which may need to be considered in subsequent tests for valid links.

If any discharge edge center lines do not match infeed edge center lines (i.e., determination block 506="No"), any distance is not less than or equal to the tolerance (i.e., determination block 508="No"), if any separation height is not acceptable (i.e., determination block 510="No"), if any discharge edge lines and infeed edge lines are not parallel (i.e., determination block 512="No"), or upon identifying any discharge edge and infeed edge separated by less than or equal to the tolerance with matching center lines, acceptable separation height, and parallel discharge edge lines as valid links, in determination block 514 the processor may determine whether any discharge edge and/or infeed edge is not associated with a valid link. If any discharge edge and/or infeed edge is not associated with a valid link (i.e., determination block 514="Yes"), in block 516 (FIG. 5C) the processor may calculate discharge edge lines and infeed edge lines for any discharge edge and/or infeed edge not associated with a valid link.

Figure 7:
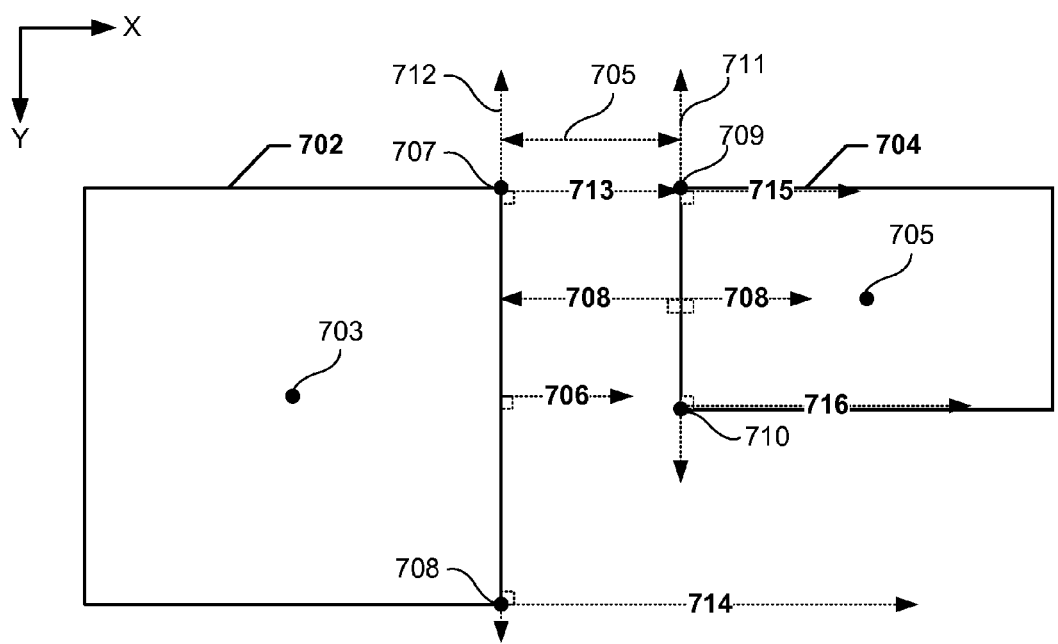

FIG. 7 illustrates an example discharge center line 706 extending perpendicularly from the discharge edge of a conveyor 702 with a center point 703. A conveyor 704 may have a center point 705 and infeed edge, and an infeed center line 708 may extend perpendicularly from the infeed edge. The discharge center line 706 and infeed center line 708 may be calculated as an equation of a line for each conveyor 702, 704 based on the data associated with each conveyor 702, 704 in the model of the material handling system. However, the center lines 706 and 708 may not match because the discharge edge of conveyor 702 may be larger than the infeed edge of conveyor 704. In an actual distribution center, conveyor 702 may include a guard to funnel material toward the infeed of conveyor 704, but because the guard may not be identified in the model of the material handling system conveyors 702 and 704 may not initially appear correctly matched due to their different widths. The infeed edge line 712 of conveyor 702 and the discharge edge line 711 of conveyor 704 may be calculated as equations of lines running along the infeed edge and discharge edge of the conveyors 702 and 704, respectively, based on the data associated with each conveyor 702, 704 in the model of the material handling system.

Figure 5C:
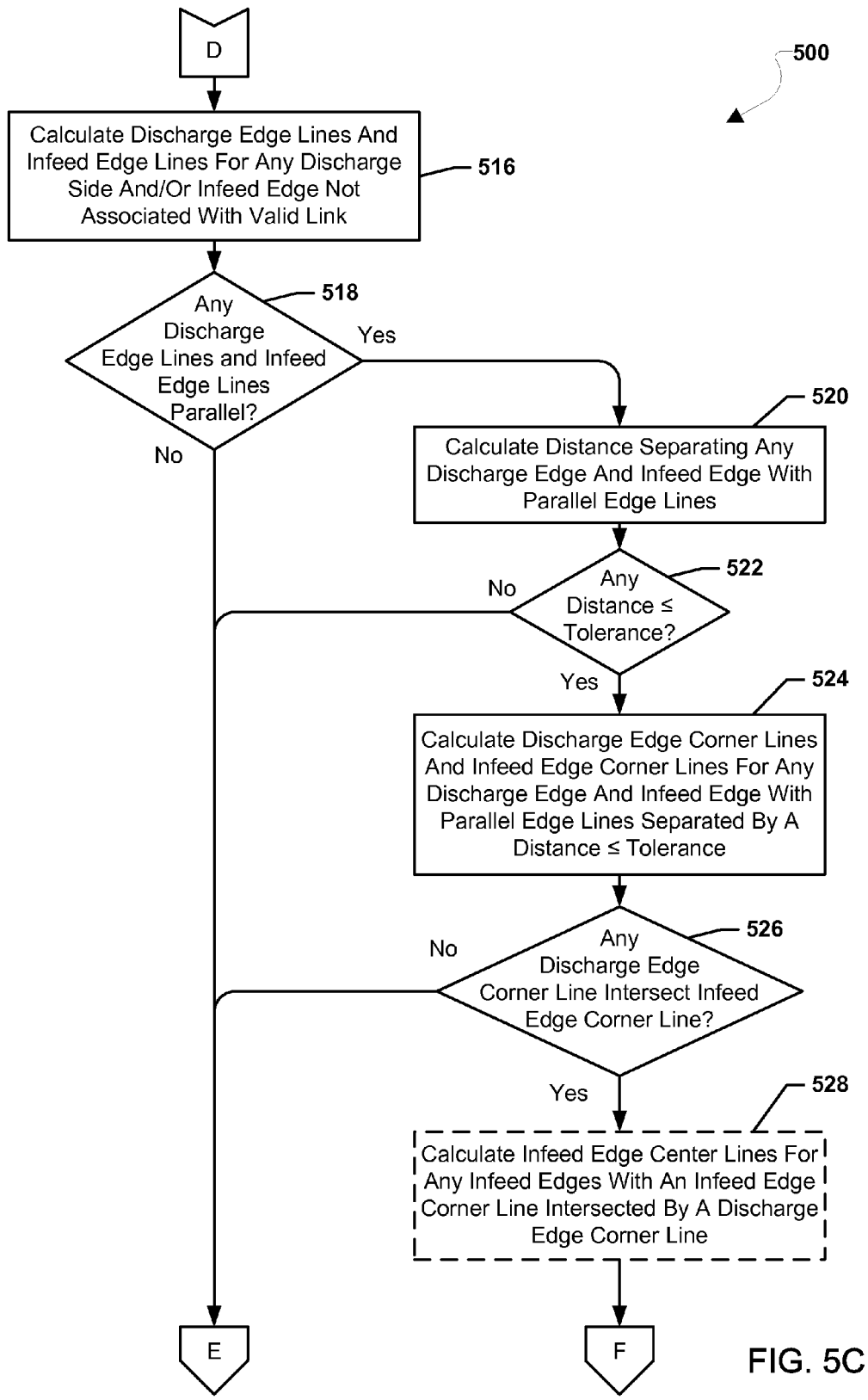

Returning to FIG. 5C, in determination block 518 the processor may determine whether any discharge edge lines and infeed edge lines are parallel. For example, the processor may compare the calculated equations of the lines of the infeed and discharge edges of the pieces of material handling equipment to each other to determine whether the lines have matching slopes. If any discharge edge lines and infeed edge lines are parallel (i.e., determination block 518="Yes"), in determination block 520 the processor may calculate a distance separating any discharge edge and infeed edge with parallel edge lines. Referring to FIG. 7, the distance 705 separating two pieces of material handling equipment 702 and 704 may be the distance 705 between the discharge edge of conveyor 702 and infeed edge of conveyor 704. Referring to FIG. 5C, in determination block 522 the processor may determine whether any distance separating any discharge edge and infeed edge with parallel edge lines is less than or equal to a tolerance. For example, the tolerance may be one inch.

If the distance is less than or equal to the tolerance (i.e., determination block 522="Yes"), in block 524 the processor may calculate discharge edge corner lines and infeed edge corner lines for any discharge edge and infeed edge with parallel edge lines separated by a distance less than or equal to the tolerance. Referring to FIG. 7, the discharge edge corner lines 713 and 714 may be rays extending perpendicular to the discharge edge of the conveyor 702 from the corners 707 and 708, respectively, of the discharge edge. The infeed edge corner lines 715 and 716 may be rays extending perpendicular to the infeed edge of the conveyor 704 from the corners 709 and 710, respectively, of the infeed edge. The infeed edge corner lines 715, 716 of conveyor 702 and the discharge edge corner lines 713, 714 of conveyor 704 may be calculated as equations of lines based on the data associated with each conveyor 702, 704 in the model of the material handling system.

Figure 5D:
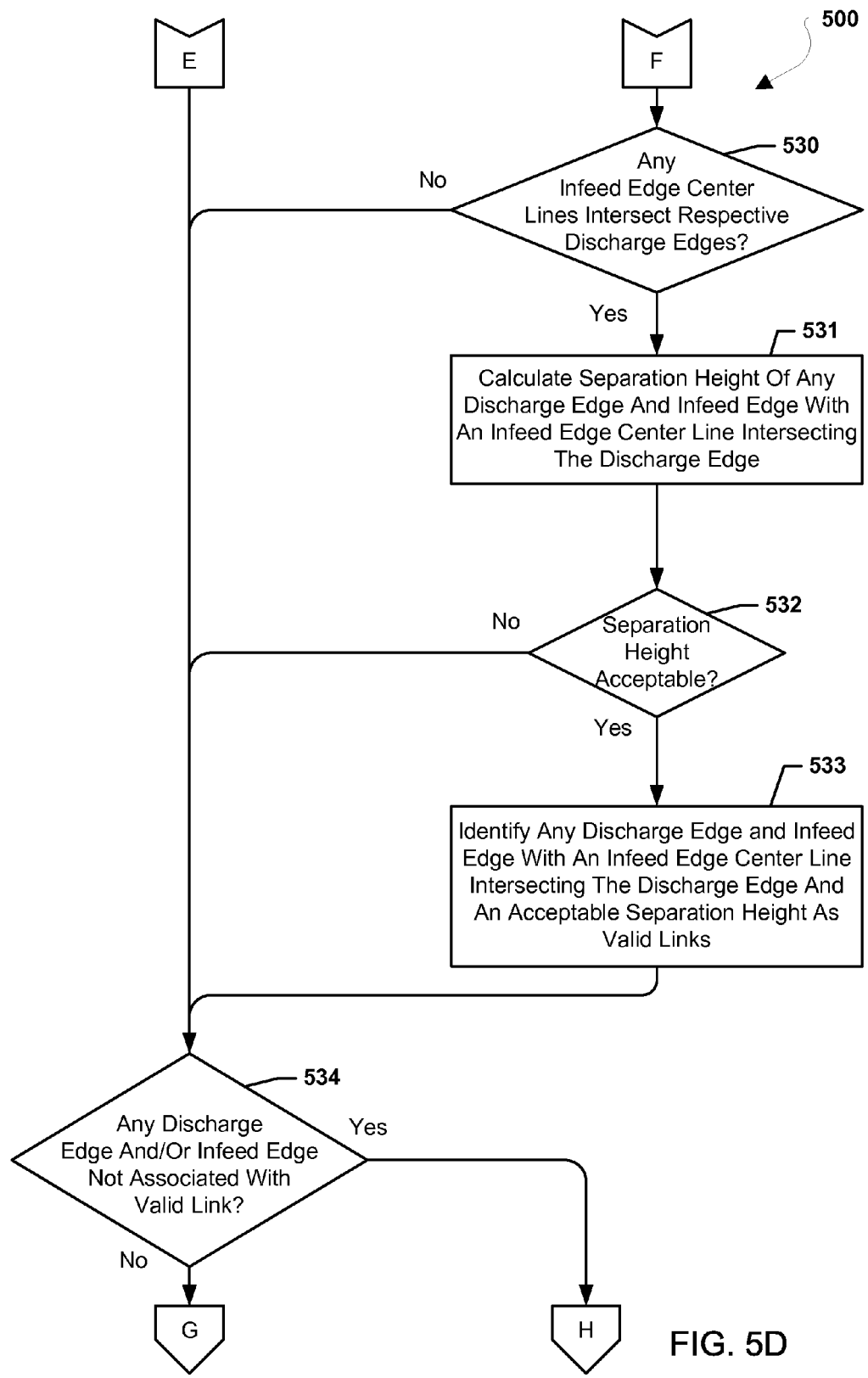
Figure 5E:
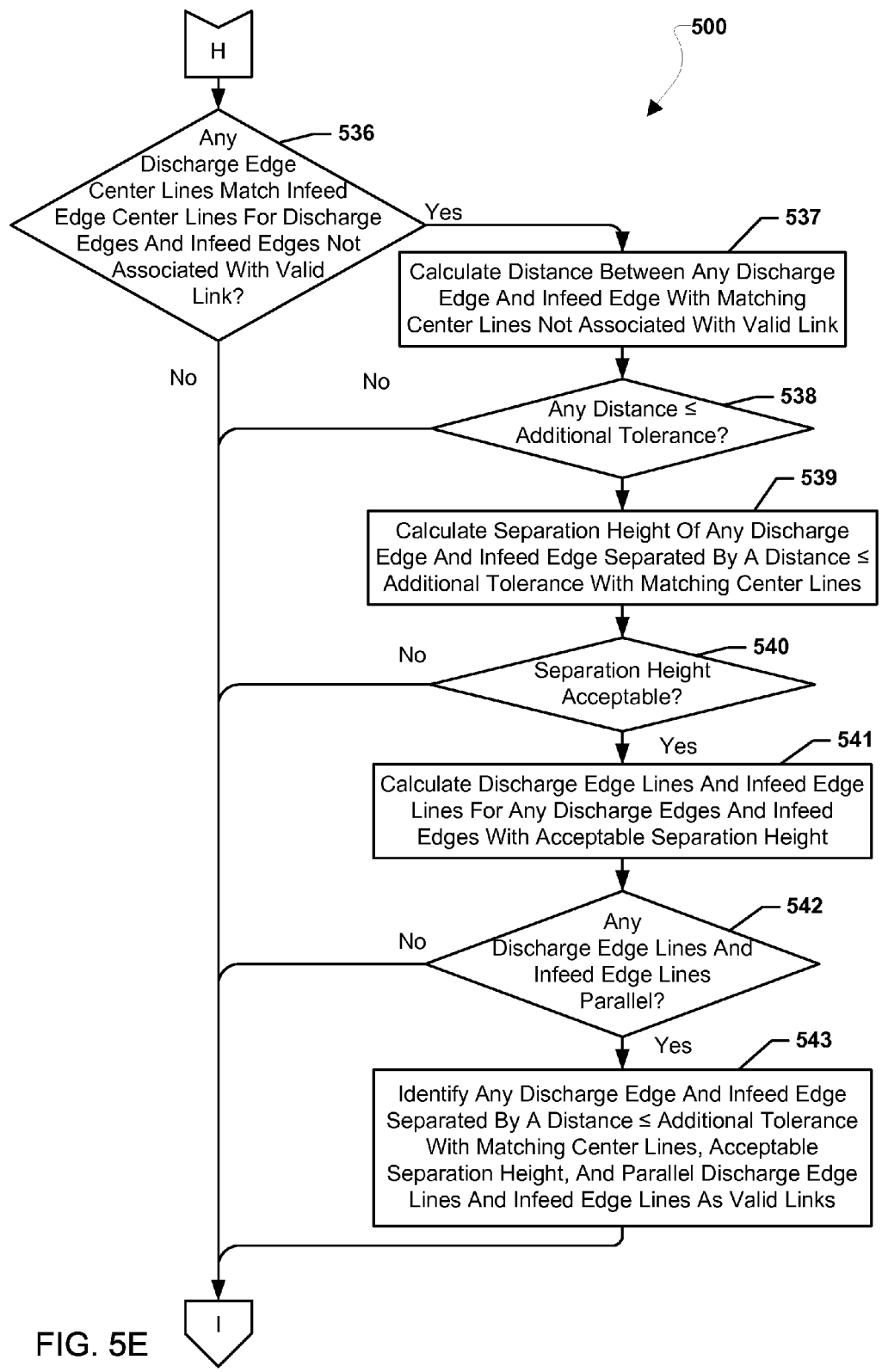

Referring to FIG. 5C, in determination block 526 the processor may determine whether any discharge edge corner line intersects an infeed edge corner line. For example, the processor may determine a discharge edge corner line intersects an infeed edge corner line when the equations of the lines are the same. If any discharge edge corner line intersects an infeed edge corner line (i.e., determination block 526="Yes"), in optional block 528 the processor may calculate infeed edge center lines for any infeed edges with an infeed edge corner line intersected by a discharge edge corner line. Block 528 may be optional because the center lines may have already been calculated in block 504 (FIG. 5A). Referring to FIG. 5D, in determination block 530 the processor may determine whether any infeed edge center lines intersect respective discharge edges, i.e., the parallel discharge edge with the discharge edge corner line intersecting the infeed edge corner line and the discharge edge and infeed edge separated by a distance less than or equal to the tolerance. As an example, referring to FIG. 7, the center line 708 of the conveyor 704 may intersect the discharge edge of conveyor 702. Referring to FIG. 5D, if any infeed edge center lines intersect respective discharge edges (i.e., determination block 530="Yes"), in block 531 the processor may calculate a separation height of any discharge edge and infeed edge separated by less than or equal to the tolerance with an infeed edge center line intersecting the discharge edge. As an example, the processor may calculate a separation height by calculating the height of the discharge edge and infeed edge and subtracting the height of the infeed edge from the height of the discharge edge.

In determination block 532, in a manner similar to that of block 510 discussed above with reference to FIG. 5B, the processor may determine whether the separation height is acceptable. If the separation height is acceptable (i.e., determination block 532="Yes"), in block 533 the processor may identify any discharge edge and infeed edge with an infeed edge center line intersecting the discharge edge and an acceptable separation height as valid links.

If any discharge edge lines and infeed edge lines are not parallel (i.e., determination block 518="No), any distance is not less than or equal to the tolerance (i.e., determination block 522="No"), any discharge edge corner line does not intersect an infeed edge corner line (i.e., determination block 526="No"), any infeed edge center lines do not intersect respective discharge edges (i.e., determination block 530="No"), the separation height is not acceptable (i.e., determination block 532="No"), or upon identifying any discharge edge and infeed edge with an infeed edge center line intersecting the discharge edge and an acceptable separation height as valid links, in determination block 534 the processor may determine whether any discharge edge and/or infeed edge is not associated with a valid link. If any discharge edge and/or infeed edge is not associated with a valid link (i.e., determination block 534="Yes"), in determination block 536 of FIG. 5E the processor may determine whether any discharge edge center lines match infeed edge center lines for discharge edges and infeed edges not associated with a valid link. As an example, in a manner similar to that discussed above with reference to block 506 (FIG. 5A), the processor may determine whether any two pieces of material handling equipment have the infeed edge center line equations that are the same as a discharge edge center line equation.

If any discharge edge center lines match infeed edge center lines for discharge edges and infeed edges not associated with a valid link (i.e., determination block 536="Yes"), in block 537 the processor may calculate a distance separating any discharge edge and infeed edge with matching center lines. In determination block 538 the processor may determine whether any distance separating any discharge edge and infeed edge with matching center lines is less than or equal to an additional tolerance. For example, the additional tolerance may be one and a half inches. If the distance is less than or equal to the additional tolerance (i.e., determination block 538="Yes"), in block 539 the processor may calculate a separation height of any discharge edge and infeed edge separated by less than or equal to the tolerance with matching center lines. As an example, the processor may calculate a separation height by calculating the height of the discharge edge and infeed edge and subtracting the height of the infeed edge from the height of the discharge edge.

In determination block 540, in a manner similar to that of block 510 discussed above with reference to FIG. 5B, the processor may determine whether the separation height is acceptable. If the separation height is acceptable (i.e., determination block 540="Yes"), in block 541, in a manner similar to that of block 511 discussed above with reference to FIG. 5B, the processor may calculate the discharge edge lines and infeed edge lines for any discharge edges and infeed edges with acceptable separation heights. In determination block 542 the processor may determine whether any discharge edge lines and infeed edge lines are parallel in a manner similar to that discussed above with reference to block 512 of FIG. 5B. If any discharge edge lines and infeed edge lines are parallel (i.e., determination block 542="Yes"), in block 543 the processor may identify any discharge edge and infeed edge separated by less than or equal to the additional tolerance with matching center lines, an acceptable separation height, and parallel discharge edge lines and infeed edge lines as valid links.

Figure 8A:
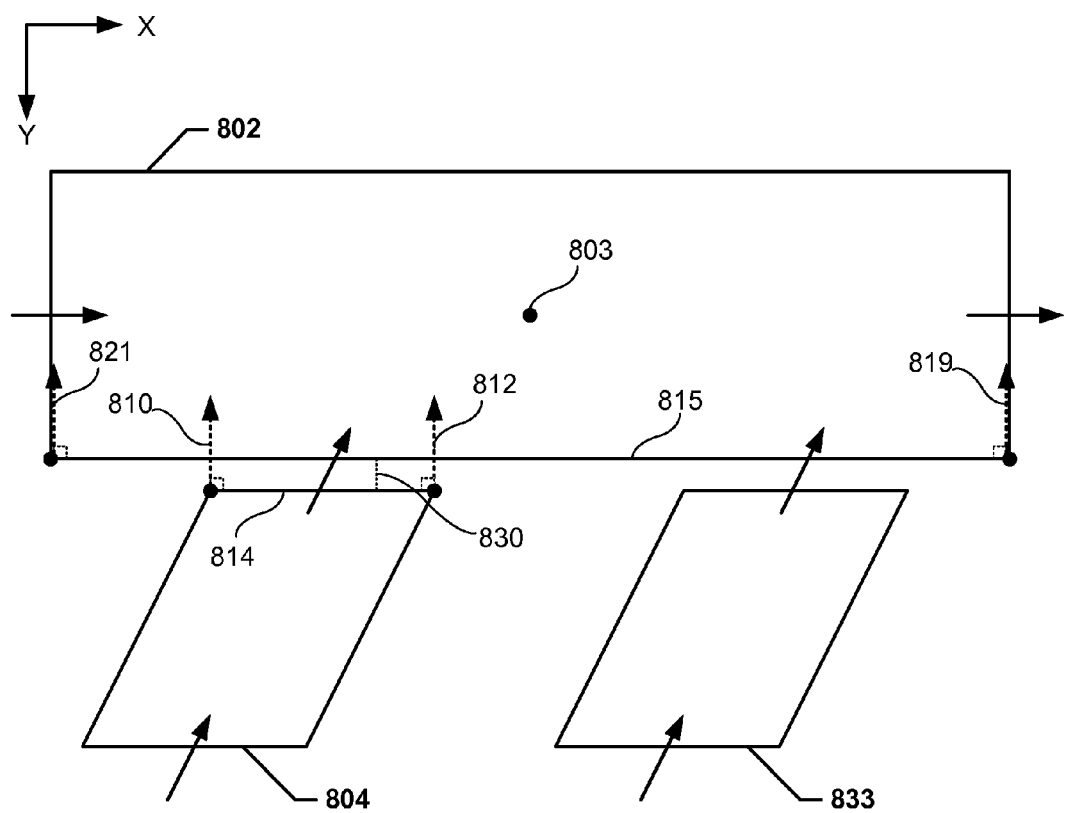
Figure 8B:
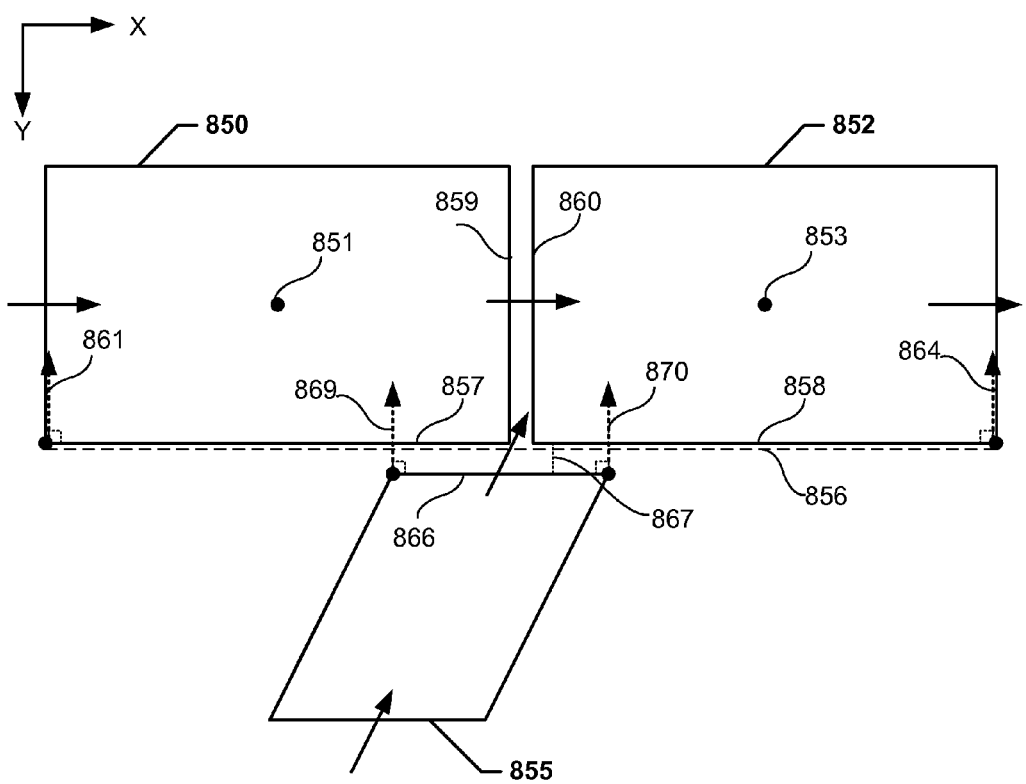

If any discharge edge center lines do not match infeed edge center lines (i.e., determination block 536="No"), any distance is not less than or equal to the additional tolerance (i.e., determination block 538="No"), any separation height is not acceptable (i.e., determination block 540="No"), any discharge edge lines and infeed edge lines are not parallel (i.e., determination block 542="No"), or upon identifying any discharge edge and infeed edge separated by less than or equal to the tolerance with matching center lines, an acceptable separation height, and parallel discharge edge lines and infeed edge lines as valid links, in determination block 544 (FIG. 5F) the processor may determine whether any discharge edge and/or infeed edge is not associated with a valid link. If any discharge edge and/or infeed edge is not associated with a valid link (i.e., determination Hock 544="Yes"), in block 546 the processor may determine Whether there are any infinite infeed type equipment or edges. In an embodiment, infinite infeed equipment/edges may not be removed from the listing of material handling equipment/edges and may be included continually throughout all link validation determinations regardless of whether a valid link has already been found to include an infinite infeed equipment/edge. An infinite infeed equipment or edge may be a piece of material handling equipment (or a grouping of pieces of material handling equipment effectively forming a single edge), such as a junction conveyor or conveyors, where one or more edges may be configured to receive incoming material along the entire length of that edge from one or more different discharging pieces of material handling equipment. FIG. 8A illustrates an example of a single junction conveyor 802 with center point 803, such as a multiple infeed merge conveyor, receiving material discharged from two conveyors 804, 833 along an infinite infeed edge 815. FIG. 8B illustrates an example of a grouping of two junction conveyors 850 and 852 with respective center points 851 and 853, such as two junction conveyors, that together may be handled as one infinite infeed equipment or edge receiving material discharged from conveyor 855 along an infinite infeed edge 856. The junction conveyors 850 and 852 may be handled as one infinite infeed equipment or edge because the discharge edge 859 of junction conveyor 850 and the infeed edge 860 of junction conveyor 852 may be a valid link, effectively forming a continuous infinite infeed edge 856 from the infinite infeed edges 857 and 858 of junction conveyors 851 and 853, respectively.

Figure 5F:
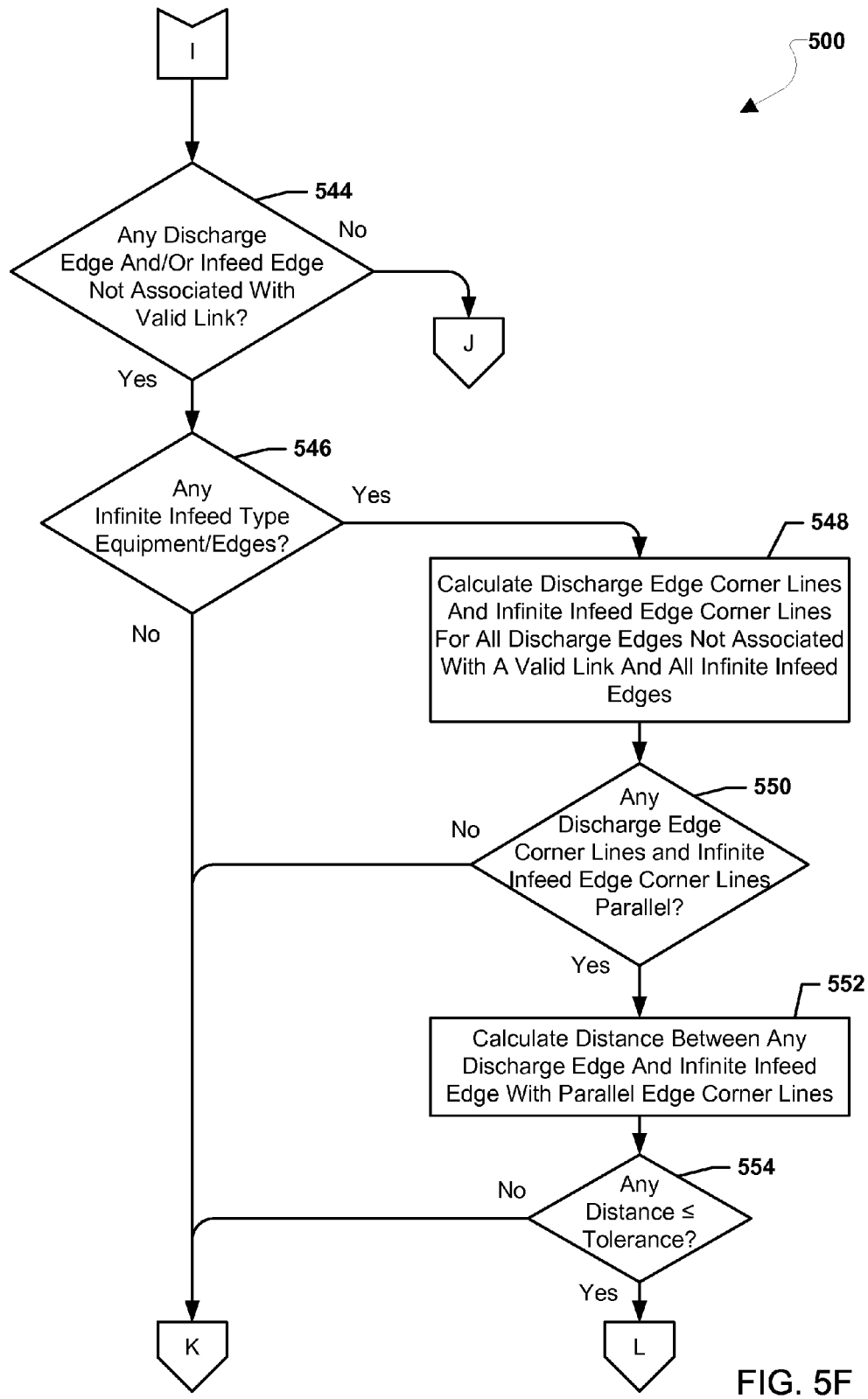
Figure 5G:
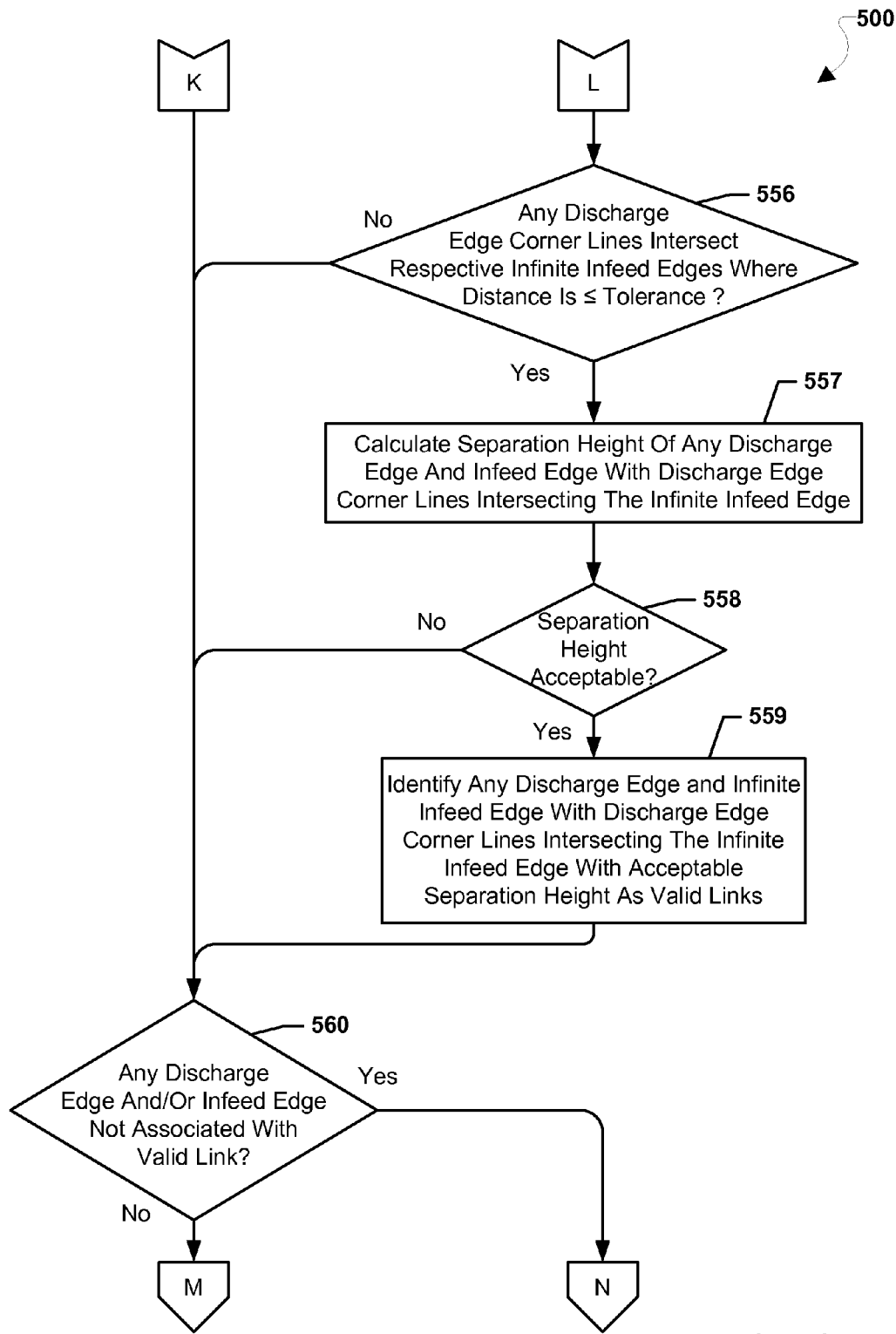

Referring to FIG. 5F, if there are any infinite infeed type equipment/edges (i.e., determination block 546="Yes"), in block 548 the processor may calculate the discharge edge corner lines and infinite infeed edge corner lines for all discharge edges not associated with a valid link and all infinite infeed edges. For example, referring to FIG. 8A, discharge edge corner lines 810 and 812 for discharge edge 814 of conveyor 804 may be calculated along with infeed edge corner lines 819 and 821 for infinite infeed edge 815 of conveyor 802. As another example, referring to FIG. 8B, discharge edge corner lines 869 and 870 for discharge edge 86 of conveyor 855 may be calculated along with infeed edge corner line 861 for conveyor 851 and infinite edge corner line 864 for conveyor 852 representing the corners of the continuous edge 856. Referring to FIG. 5F, in determination block 550 the processor may determine whether any discharge edge corner lines and infinite infeed edge corner lines are parallel. For example, the processor may compare the slope of the edge corner lines. If the edge corner lines are parallel (i.e., determination block 550="Yes"), in block 552 the processor may calculate a distance between any discharge edge and infinite infeed edge with parallel edge corner lines. For example, referring to FIG. 8A, the processor may calculate a distance 830 between discharge edge 814 and infeed edge 815. As another example, referring to FIG. 8B, the processor may calculate a distance 867 between discharge edge 866 and infeed edge 856.

Referring to FIG. 5F, in determination block 554 the processor may determine whether the distance is less than or equal to a tolerance, such as one inch. If the distance is less than or equal to the tolerance (i.e., determination block 554="Yes"), in determination block 556 of FIG. 5G the processor may determine whether any discharge edge corner lines intersect respective infinite infeed edges where the distance is less than or equal to the tolerance. If the discharge edge corner lines intersect (i.e., determination block 556="Yes"), in block 557 the processor may calculate a separation height of any discharge edge and infinite infeed edge with discharge edge corner lines intersecting the infinite infeed edge. As an example, the processor may calculate a separation height by calculating the height of the discharge edge and infeed edge and subtracting the height of the infeed edge from the height of the discharge edge.

In determination block 558, in a manner similar to that of block 510 discussed above with reference to FIG. 5B, the processor may determine whether the separation height is acceptable. If the separation height is acceptable (i.e., determination block 558="Yes"), in block 559 the processor may identify any discharge edge and infinite infeed edge with discharge edge corner lines intersecting the infinite infeed edge with an acceptable separation height as valid links.

Figure 9:
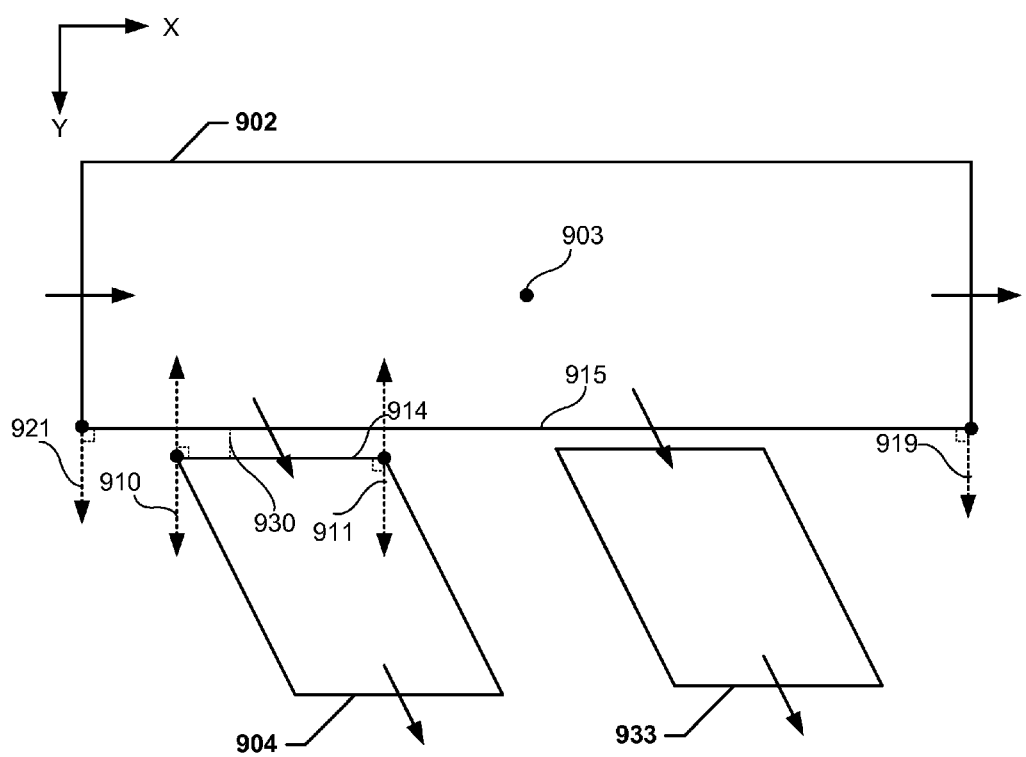

If any infinite infeed type equipment/edges are not present in the material handling system model (i.e., determination block 546="No"), any discharge edge corner lines and infinite infeed edge corner lines are not parallel (i.e., determination block 550="No"), any distance is not less than or equal to the tolerance (i.e., determination block 554="No"), any discharge edge corner lines intersect respective infinite infeed edges where the distance is not less than or equal to the tolerance (i.e., determination block 556="No"), any separation heights are not acceptable (i.e., determination block 558="No"), or upon identifying any discharge edge and infinite infeed edge with discharge edge corner lines intersecting the infinite infeed edge with an acceptable separation height as valid links, in determination block 560 the processor may determine whether any discharge edge and/or infeed edge is not associated with a valid link. If any discharge edge and/or infeed edge is not associated with a valid link (i.e., determination block 560="Yes"), in block 562 of FIG. 5H the processor may determine whether there are any infinite discharge type equipment or edges. In an embodiment, infinite discharge equipment/edges may not be removed from the listing of material handling equipment/edges and may be included continually throughout all link validation determinations regardless of whether a valid link has already been found to include an infinite discharge equipment/edge. An infinite discharge equipment or edge may be a piece of material handling equipment where one or more edges may be configured to output material along the entire length of that edge to one or more different receiving pieces of material handling equipment. FIG. 9 illustrates an example of junction conveyor 902 with center point 903 outputting material to two conveyors 904, 933 along an infinite discharge edge 915.

Figure 5H:
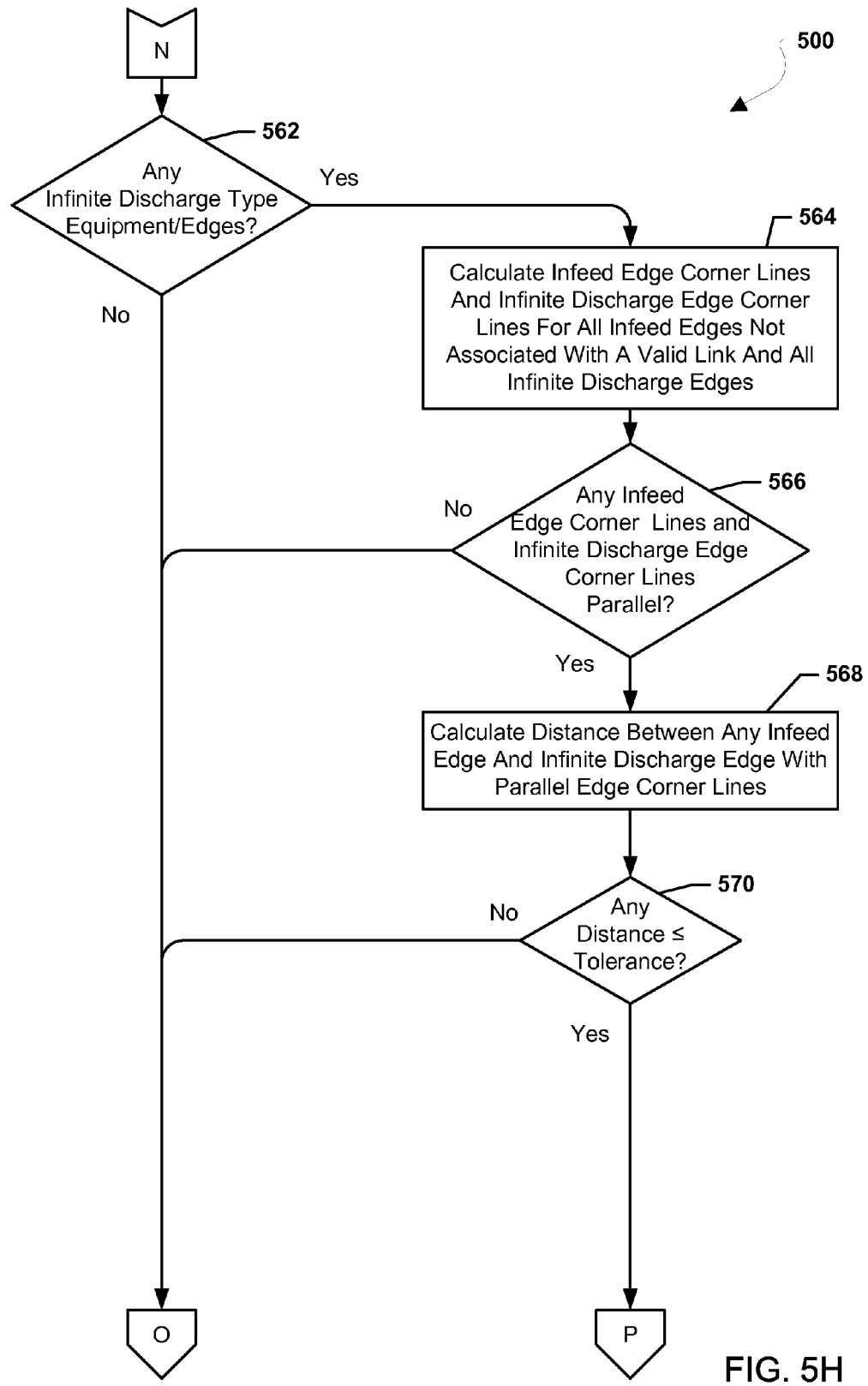
Figure 5I:
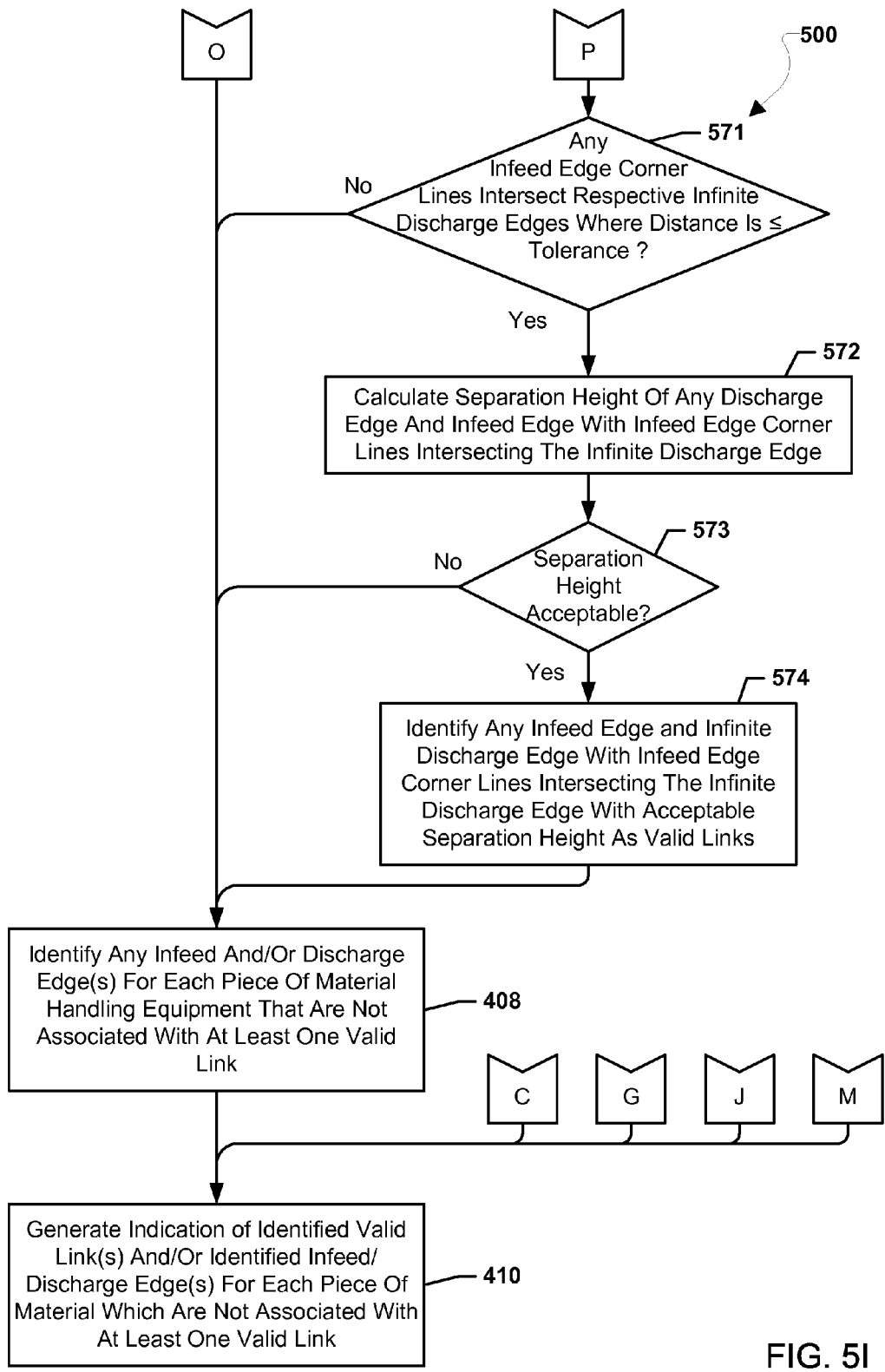

Referring to FIG. 5H, if there are any infinite discharge type equipment/edges (i.e., determination block 562="Yes"), in block 564 the processor may calculate the infeed edge corner lines and infinite discharge edge corner lines for all infeed edges not associated with a valid link and all infinite infeed edges. For example, referring to FIG. 9, discharge edge corner lines 910 and 912 for infeed edge 914 of conveyor 904 may be calculated along with discharge edge corner line 919 and 921 for infinite discharge edge 915 of conveyor 902. Referring to FIG. 5H, in determination block 566 the processor may determine whether any infeed edge corner lines and infinite discharge edge corner lines are parallel. For example, the processor may compare the slope of the edge corner lines. If the edge corner lines are parallel (i.e., determination block 566="Yes"), in block 568 the processor may calculate a distance between any infeed edge and infinite discharge edge with parallel edge corner lines. For example, referring to FIG. 9, the processor may calculate a distance 930 between infeed edge 914 and discharge edge 915. In determination block 570, the processor may determine whether the distance is less than or equal to the tolerance, such as one inch. If the distance is less than or equal to a tolerance (i.e., determination block 570="Yes"), in determination block 571 of FIG. 5I the processor may determine whether any infeed edge corner lines intersect respective infinite discharge edges where the distance is less than or equal to the tolerance. If the infeed edge corner lines intersect (i.e., determination block 571="Yes"), in block 572 the processor may calculate a separation height of any infeed edge and infinite discharge edge with infeed edge corner lines intersecting the infinite discharge edge. As an example, the processor may calculate a separation height by calculating the height of the discharge edge and infeed edge and subtracting the height of the infeed edge from the height of the discharge edge.

In determination block 573, in a manner similar to that of block 510 discussed above with reference to FIG. 5B, the processor may determine whether the separation height is acceptable. If the separation height is acceptable (i.e., determination block 573="Yes"), in block 574 the processor may identify any infeed edge and infinite discharge edge with infeed edge corner lines intersecting the infinite discharge edge with an acceptable separation height as valid links.

If there are not any infinite discharge type equipment/edges (i.e., determination block 562="No"), if any infeed edge corner lines and infinite discharge edge corner lines are not parallel (i.e., determination block 566="No"), any distance is greater than the tolerance (i.e., determination block 570="Yes"), any infeed edge corner lines do not intersect respective infinite discharge edges where the distance is less than the tolerance (i.e., determination block 571="No"), a separation height is not acceptable (i.e., determination block 573="No"), or upon identifying any infeed edge and infinite discharge edge with infeed edge corner lines intersecting the infinite discharge edge and an acceptable height separation as valid links, as discussed above, in block 408 the processor may identify any infeed and/or discharge edges for each piece of material handling equipment that are not associated with at least one valid link. If all discharge edges and/or infeed edges are associated with a valid link (i.e., determination blocks 514, 534, 544, or 560="No") or upon identifying any infeed and/or discharge edges for each piece of material handling equipment that are not associated with at least one valid link, as discussed above, in block 410 the processor may generate an indication of the identified valid links and/or may generate an indication of identified infeed and discharge edges for each piece of material handling equipment which are not associated with at least one valid link.

Figure 10:
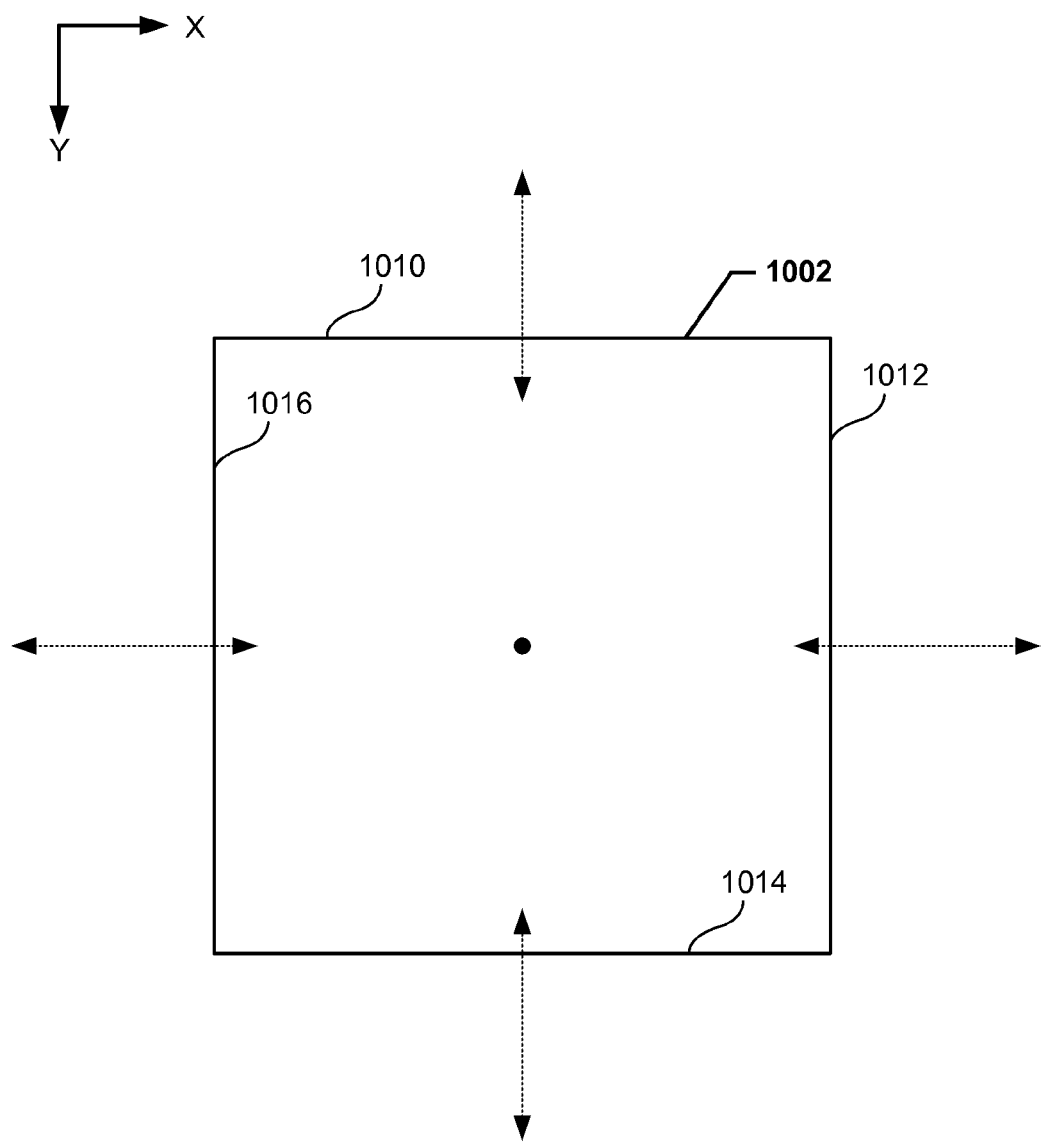
FIG. 10 is a block diagram illustrating characteristics of a right angle transfer piece of material handling equipment in a physical model of a material handling system.

FIG. 10 is a block diagram illustrating characteristics of a right angle transfer piece of material handling equipment 1002 that may be included in a physical model of a material handling system. In a right angle transfer piece of material handling equipment 1002 edges 1010, 1012, 1014, and 1016 may be both infeed and discharge edges as material may move into or out of each edge 1010, 1012, 1014, and 1016 depending on the operation of the right angle transfer piece of material handling equipment 1002. While the material handling equipment discussed above with reference to FIGS. 6-9 are illustrated as having single direction infeed or discharge edges, one or ordinary skill in the art would understand that the methods 400 and 500 described above are equally applicable when the pieces of material handling equipment included in the material handling system model include dual infeed and discharge edges, such as right angle transfers.

Figure 11:
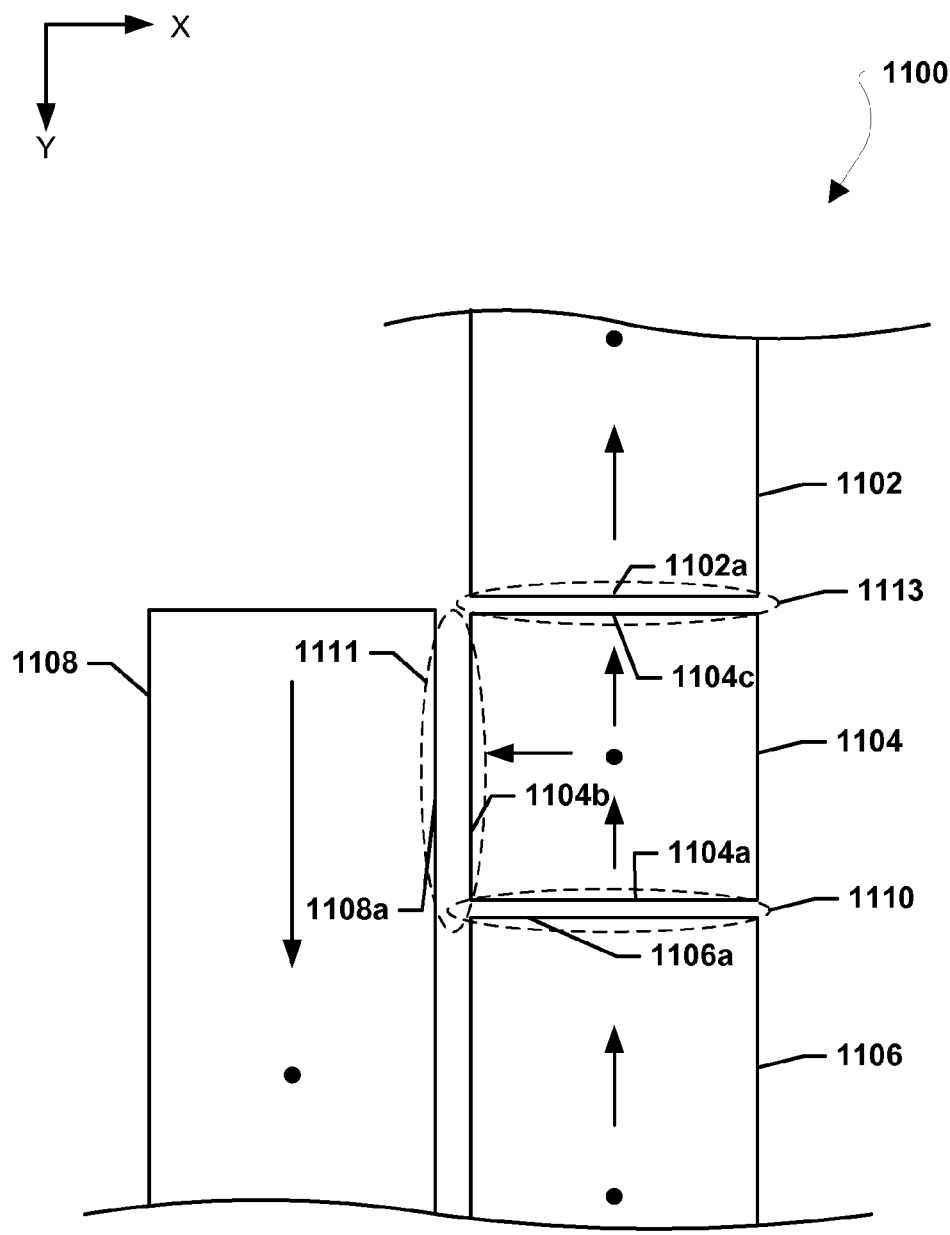
FIG. 11 is a block diagram illustrating relationships between infeed and discharge edges of pieces of material handling equipment in a physical model of a material handling system.

FIG. 11 is a block diagram illustrating relationships between infeed and discharge edges of pieces of material handling equipment 1102, 1104, 1106, and 1108 and valid links 1110, 1111, and 1113 in a physical model of a material handling system 1100. Conveyor 1106 may feed material to a right angle transfer 1104. The discharge edge 1106a of the conveyor 1106 and infeed edge 1104a of the right angle transfer 1104 may meet the requirements to be identified as a valid link 1110. Right angle transfer 1104 may feed material to conveyor 1108 and conveyor 1102. The discharge edge 1104b of right angle transfer 1104 and infeed edge 1108a of conveyor 1108 may meet the requirements to be identified as a valid link 1111. The discharge edge 1104c of right angle transfer 1104 and infeed edge 1102a of conveyor 1102 may meet the requirements to be identified as a valid link 1113.

FIG. 12A is a data structure diagram of an example listing 1200 of valid links between pieces of material handling equipment in a physical model of a material handling system. Each valid link may be assigned a link identifier 1202 and may indicate the equipment ID 1204, type 1206, and edge 1208 of each piece of material handling equipment forming a valid link.

FIG. 12B is a data structure diagram of an example listing 1250 of unassociated edges of pieces of material handling equipment in a physical model of a material handling system. Each unassociated edge 1256 may be indicated with its equipment ID 1252 and equipment type 1254.

Figure 13:
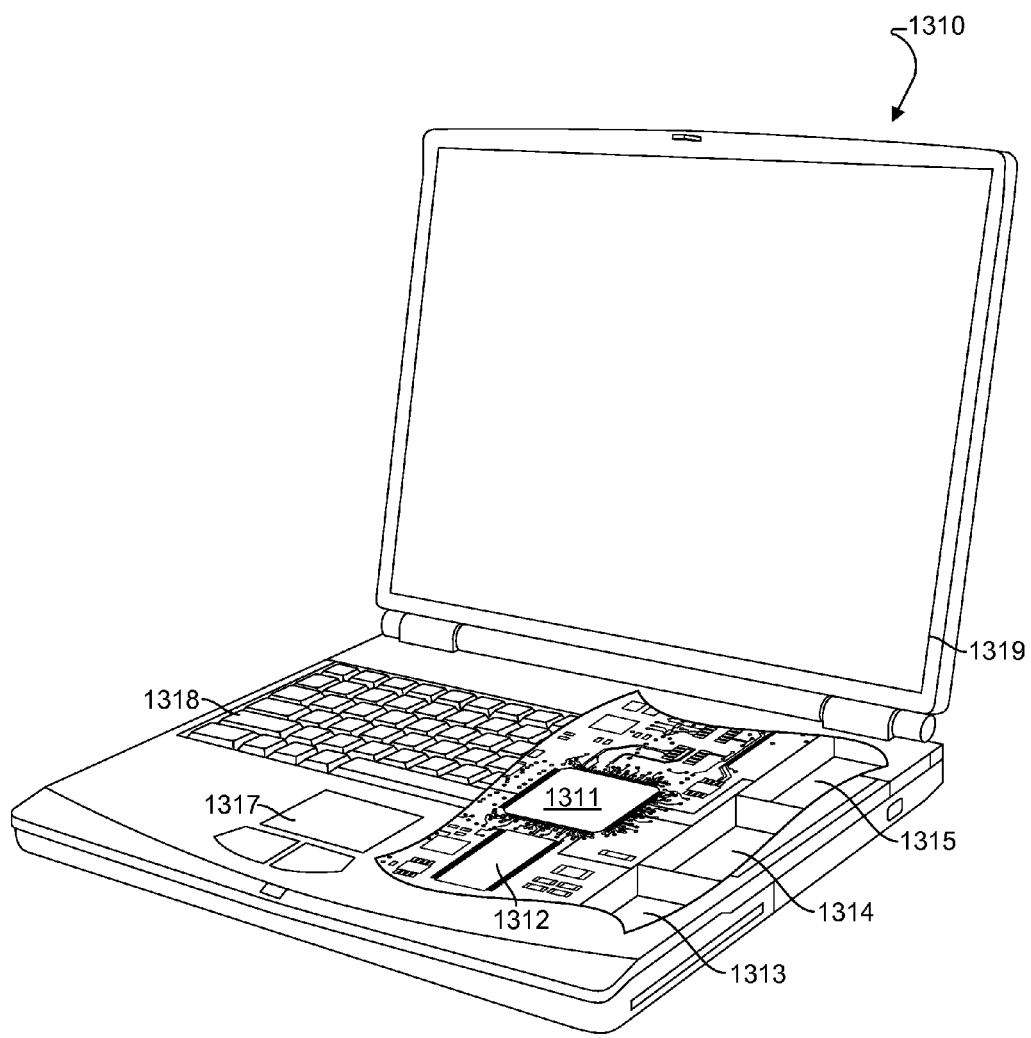
FIG. 13 is a component block diagram of an example computing device suitable for use with the various embodiments.

The various embodiments described above may also be implemented within a variety of computing devices, such as a laptop computer 1310 illustrated in FIG. 13. A laptop computer 1310 may include a touch pad touch surface 1317 that serves as the computer's pointing device, and thus may receive drag, scroll, and flick gestures similar to those implemented on mobile computing devices equipped with a touch screen display. A laptop computer 1310 will typically include a processor 1311 coupled to volatile memory 1312 and a large capacity nonvolatile memory, such as a disk drive 1313 or Flash memory. The laptop computer 1310 may also include a floppy disc drive 1314 and a compact disc (CD) or DVD drive 1315 coupled to the processor 1311. The warehouse control computer 1310 may also include a number of connector ports coupled to the processor 1311 for establishing wired and/or wireless data connections or receiving external memory devices, such as a USB or FireWire™ connector sockets, or other wired and/or wireless network connection circuits and/or wired and/or wireless network interfaces for coupling the processor 1311 to wired and/or wireless networks. The connector ports coupled to the processor 1311 may also enable the processor 1311 to establish connections to cloud computing/network resources, such as network/cloud storage resources, network/cloud processing resources, etc. In a notebook configuration, the computer housing may include the touchpad 1317, the keyboard 1318, and the display 1319 all coupled to the processor 1311. Other configurations of the laptop computer 1310 may include a computer mouse or trackball coupled to the processor (e.g., via a USB input) as are well known, which may also be used in conjunction with the various embodiments.

Figure 14:
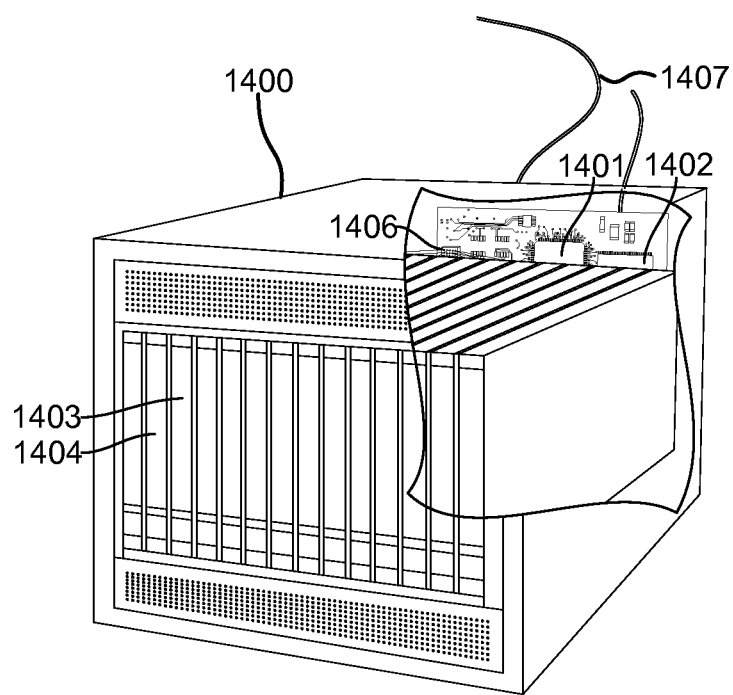
FIG. 14 is a component diagram of an example server suitable for use with the various embodiments.

The various embodiments may also be implemented on any of a variety of commercially available server devices, such as the server 1400 illustrated in FIG. 14. Such a server 1400 typically includes a processor 1401 coupled to volatile memory 1402 and a large capacity nonvolatile memory, such as a disk drive 1403. The server 1400 may also include a floppy disc drive, compact disc (CD) or DVD disc drive 1404 coupled to the processor 1401. The server 1400 may also include network access ports 1406 coupled to the processor 1401 for establishing network interface connections with a network 1407, such as a local area network coupled to other system computers and servers, the Internet, the public switched telephone network, and/or a cellular data networks (e.g., CDMA, TDMA, GSM, PCS, 3G, 4G, LTE, or any other type of cellular data network). The network access ports 1406 coupled to the processor 1401 may also enable the processor 1401 to establish connections to cloud computing/network resources, such as network/cloud storage resources, network/cloud processing resources, etc.

The processors 1311 and 1401 may be any programmable microprocessor, microcomputer or multiple processor chip or chips that can be configured by software instructions (applications) to perform a variety of functions, including the functions of the various embodiments described above. In some devices, multiple processors may be provided, such as one processor dedicated to wired and/or wireless communication functions and one processor dedicated to running other applications. Typically, software applications may be stored in the internal memory 1312, 1313, 1404, and 1406 before they are accessed and loaded into the processors 1311 and 1401. The processors 1311 and 1401 may include internal memory sufficient to store the application software instructions. In many devices the internal memory may be a volatile or nonvolatile memory, such as flash memory, or a mixture of both. For the purposes of this description, a general reference to memory refers to memory accessible by the processors 1311 and 1401 including internal memory or removable memory plugged into the device and memory within the processor 1311 and 1401 themselves.

The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), a graphics processing unit (GPU), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, one or more microprocessor in combination with a GPU, or any other such configuration. Alternatively, some steps or methods may be performed by circuitry that is specific to a given function.

In one or more exemplary aspects, the functions described may be implemented in hardware, software, firmware, or any combination thereof If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A method, comprising:
    receiving, at a processor, a model of a facility, the model identifying pieces of material handling equipment and data associated with each piece of the identified pieces of material handling equipment, the data comprising an equipment type;
    generating, at the processor, a listing of the pieces of material handling equipment infeed and discharge edges based at least in part on the received model and the equipment type;
    identifying, at the processor, one or more valid links between the pieces of material handling equipment in the listing based at least in part on the infeed and discharge edges that do not appear correctly matched due to their different widths by applying a rule associated with the respective equipment types of the pieces;
    generating, at the processor, an indication of the identified valid links; and
    creating a model of the valid links ,indicating how material may move through the material handling system.

2. The method of claim 1, further comprising:
    identifying, at the processor, any infeed or discharge edges for each piece of material handling equipment in the listing that are not associated with at least one of the identified valid links; and
    generating, at the processor, an indication of the identified infeed or discharge edges for each piece of material handling equipment that are not associated with at least one of the identified valid links.

3. The method of claim 2, wherein:
    the model of the facility is a computer aided design (CAD) file;
    the data associated with the pieces of material handling equipment is one or more of an equipment identifier, equipment type indication, a center position, an orientation, a floor length, and a floor width.

4. The method of claim 1, wherein identifying, at the processor, one or more valid links between the pieces of material handling equipment in the listing based at least in part on the infeed and discharge edges comprises:
    calculating, at the processor, discharge edge lines and infeed edge lines for any discharge edge and infeed edge not associated with a valid link;
    determining, at the processor, whether any discharge edge lines and infeed edge lines are parallel;
    calculating, at the processor, a distance separating any discharge edge and infeed edge with parallel discharge edge lines and infeed edge lines;

determining, at the processor, whether the distance separating any parallel discharge edges and infeed edges is less than or equal to a second tolerance;

calculating, at the processor, discharge edge corner lines and infeed edge corner lines for any discharge edge and infeed edge with parallel discharge edges and infeed edges separated by the distance less than or equal to a second tolerance;

determining, at the processor, whether any discharge edge corner line intersects an infeed edge corner line for any discharge edge and infeed edge with parallel discharge edges and infeed edges separated by the distance less than or equal to the second tolerance;

determining, at the processor, whether any infeed edge center line intersects the discharge edge for any parallel discharge edge and infeed edge with the discharge edge corner line intersecting the infeed edge corner line and the discharge edge and infeed edge separated by the distance less than or equal to the second tolerance;

calculating, at the processor, a separation height between each discharge edge and infeed edge with the infeed edge center line intersecting the discharge edge for any parallel discharge edge and infeed edge with the discharge edge corner line intersecting the infeed edge corner line and the discharge edge and infeed edge separated by the distance less than or equal to the second tolerance;

determining, at the processor, whether the separation height is acceptable; and identifying, at the processor, each discharge edge and infeed edge with the infeed edge center line intersecting the discharge edge for any parallel discharge edge and infeed edge with the discharge edge corner line intersecting the infeed edge corner line, the discharge edge and infeed edge separated by the distance less than or equal to the second tolerance, and an acceptable separation height as a valid link.

5. The method of claim 4, wherein the second tolerance is one inch.

6. The method of claim 1, wherein identifying, at the processor, one or more valid links between the pieces of material handling equipment in the listing based at least in part on the infeed and discharge edges comprises:

determining, at the processor, whether any infinite infeed edges are indicated in the listing;

calculating, at the processor, discharge edge corner lines and infinite infeed edge corner lines for all discharge edges not associated with a valid link and any infinite infeed edges in response to determining any infinite infeed edges are indicated in the listing;

determining, at the processor, whether any discharge edge corner lines and infinite infeed edge corner lines are parallel;

calculating, at the processor, a distance separating any discharge edge and infinite infeed edge with parallel edge corner lines;

determining, at the processor, whether the distance separating any discharge edge and infinite infeed edge with parallel edge corner lines is less than or equal to a third tolerance;

determining, at the processor, whether the discharge edge corner lines intersect the infinite infeed edge for any discharge edge and infinite infeed separated by the distance less than or equal to the third tolerance with parallel edge corner lines;

calculating, at the processor, a separation height between each discharge edge and infeed edge with the discharge edge corner lines intersecting the infinite infeed edge separated by the distance less than or equal to the third tolerance with parallel edge corner lines;

determining, at the processor, whether the separation height is acceptable; and identifying, at the processor, each parallel discharge edge and infinite infeed edge with the discharge edge corner lines intersecting the infinite infeed edge separated by the distance less than or equal to the third tolerance with parallel edge corner lines and an acceptable separation height as a valid link.

7. The method of claim 1, wherein identifying, at the processor, one or more valid links between the pieces of material handling equipment in the listing based at least in part on the infeed and discharge edges comprises:

determining, at the processor, whether any infinite discharge edges are indicated in the listing;

calculating, at the processor, infeed edge corner lines and infinite discharge edge corner lines for all infeed edges not associated with a valid link and any infinite discharge edges in response to determining any infinite discharge edges are indicated in the listing;

determining, at the processor, whether any infeed edge corner lines and infinite discharge edge corner lines are parallel;

calculating, at the processor, a distance separating any infeed edge and infinite discharge edge with parallel edge corner lines;

determining, at the processor, whether the distance separating any infeed edge and infinite discharge edge with parallel edge corner lines is less than or equal to a fourth tolerance;

determining, at the processor, whether the infeed edge corner lines intersect the infinite discharge edge for any infeed edge and infinite discharge edge separated by the distance less than or equal to the fourth tolerance with parallel edge corner lines;

calculating, at the processor, a separation height between each discharge edge and infeed edge with the infeed edge corner lines intersecting the infinite discharge edge separated by the distance less than or equal to the fourth tolerance with parallel edge corner lines;

determining, at the processor, whether the separation height is acceptable; and identifying, at the processor, each parallel infeed edge and infinite discharge edge with the infeed edge corner lines intersecting the infinite discharge edge separated by the distance less than or equal to the fourth tolerance with parallel edge corner lines and an acceptable separation height as a valid link.

8. A method, of comprising:

receiving, at a processor, a model of a facility, the model identifying pieces of material handling equipment and data associated with each piece of the identified pieces of material handling equipment;

generating, at the processor, a listing of the pieces of material handling equipment infeed and discharge edges based at least in part on the received model;

identifying, at the processor, one or more valid links between the pieces of material handling equipment in the listing based at least in part on the infeed and discharge edges:

generating, at the processor, an indication of the identified valid links;

creating a model of the valid links indicating how material may move through the material handling system;

identifying, at the processor, any infeed or discharge edges for each piece of material handling equipment in the listing that are not associated with at least one of the identified valid links; and generating, at the processor, an indication of the identified infeed or discharge edges for each piece of material handling equipment that are not associated with at least one of the identified valid links, wherein identifying, at the processor, one or more valid links between the pieces of material handling equipment in the listing based at least in part on the infeed and discharge edges comprises:

calculating, at the processor, discharge edge center lines and infeed edge center lines for each piece of material handling equipment;

determining, at the processor, whether any discharge edge center lines match infeed edge center lines;

calculating, at the processor, a distance separating each discharge edge and infeed edge with matching center lines;

determining, at the processor, whether the distance separating each discharge edge and infeed edge with matching center lines is less than or equal to a first tolerance;

calculating, at the processor, a separation height between each discharge edge and infeed edge with the distance separating the discharge edge and the infeed edge less than or equal to the first tolerance with matching center lines;

determining, at the processor, whether the separation height is acceptable;

calculating, at the processor, discharge edge lines and infeed edge lines for each discharge edge and infeed edge with an acceptable separation height;

determining, at the processor, whether the discharge edge lines and infeed edge lines for each discharge and infeed edge with an acceptable separation height are parallel; and identifying, at the processor, each discharge edge and infeed edge with the distance separating the discharge edge and the infeed edge less than or equal to the first tolerance with matching center lines, the acceptable separation height, and parallel discharge edge lines and infeed edge lines as a valid link.

9. The method of claim 8, wherein the first tolerance is a quarter of an inch.

10. The method of claim 8, wherein the first tolerance is one and a half inches.

11. A computing device, comprising: a processor configured with processor-executable instructions to perform operations comprising:

receiving a model of a facility, the model identifying pieces of material handling equipment and data associated with each piece of the identified pieces of material handling equipment, the data comprising an equipment type;

generating a listing of the pieces of material handling equipment infeed and discharge edges based at least in part on the received model;

identifying one or more valid links between the pieces of material handling equipment in the listing based at least in part on the infeed and discharge edges that do not appear correctly matched due to their different widths by applying a rule associated with the respective equipment types of the pieces;

generating an indication of the identified valid links; and creating a model of the valid links indicating how material ma move through the material handling system.

12. The computing device of claim 11, wherein the processor is configured with processor-executable instructions to perform operations further comprising:

identifying any infeed or discharge edges for each piece of material handling equipment in the listing that are not associated with at least one of the identified valid links; and generating an indication of the identified infeed or discharge edges for each piece of material handling equipment that are not associated with at least one of the identified valid links.

13. The computing device of claim 12, wherein the processor is configured with processor-executable instructions to perform operations such that:

the model of the facility is a computer aided design (CAD) file;

the data associated with the pieces of material handling equipment is one or more of an equipment identifier, equipment type indication, a center position, an orientation, a floor length, and a floor width.

14. The computing device of claim 12, wherein the processor is configured with processor-executable instructions to perform operations such that identifying one or more valid links between the pieces of material handling equipment in the listing based at least in part on the infeed and discharge edges comprises:

determining whether any infinite infeed edges are indicated in the listing;

calculating discharge edge corner lines and infinite infeed edge corner lines for all discharge edges not associated with a valid link and any infinite infeed edges in response to determining any infinite infeed edges are indicated in the listing;

determining whether any discharge edge corner lines and infinite infeed edge corner lines are parallel;

calculating a distance separating any discharge edge and infinite infeed edge with parallel edge corner lines;

determining whether the distance separating any discharge edge and infinite infeed edge with parallel edge corner lines is less than or equal to a third tolerance;

determining whether the discharge edge corner lines intersect the infinite infeed edge for any discharge edge and infinite infeed edge separated by the distance less than or equal to the third tolerance with parallel edge corner lines;

calculating a separation height between each discharge edge and infeed edge with the discharge edge corner lines intersecting the infinite infeed edge separated by the distance less than or equal to the third tolerance with parallel edge corner lines;

determining whether the separation height is acceptable; and identifying each parallel discharge edge and infinite infeed edge with the discharge edge corner lines intersecting the infinite infeed edge separated by the distance less than or equal to the third tolerance with parallel edge corner lines and an acceptable separation height as a valid link.

15. The computing device of claim 12, wherein the processor is configured with processor-executable instructions to perform operations such that identifying one or more valid links between the pieces of material handling equipment in the listing based at least in part on the infeed and discharge edges comprises:

determining whether any infinite discharge edges are indicated in the listing;

calculating infeed edge corner lines and infinite discharge edge corner lines for all infeed edges not associated with a valid link and any infinite discharge edges in response to determining any infinite discharge edges are indicated in the listing;

determining whether any infeed edge corner lines and infinite discharge edge corner lines are parallel;

calculating a distance separating any infeed edge and infinite discharge edge with parallel edge corner lines;

determining whether the distance separating any infeed edge and infinite discharge edge with parallel edge corner lines is less than or equal to a fourth tolerance;

determining whether the infeed edge corner lines intersect the infinite discharge edge for any infeed edge and infinite discharge edge separated by the distance less than or equal to the fourth tolerance with parallel edge corner lines;

calculating a separation height between each discharge edge and infeed edge with the infeed edge corner lines intersecting the infinite discharge edge separated by the distance less than or equal to the fourth tolerance with parallel edge corner lines;

determining whether the separation height is acceptable; and identifying each parallel infeed edge and infinite discharge edge with the infeed edge corner lines intersecting the infinite discharge edge separated by the distance less than or equal to the fourth tolerance with parallel edge corner lines and an acceptable separation height as a valid link.

16. The computing device of claim 11, wherein the processor is configured with processor-executable instructions to perform operations such that identifying one or more valid links between the pieces of material handling equipment in the listing based at least in part on the infeed and discharge edges comprises:

calculating discharge edge center lines and infeed edge center lines for each piece of material handling equipment;

determining whether any discharge edge center lines match infeed edge center lines;

calculating a distance separating each discharge edge and infeed edge with matching center lines;

determining whether the distance separating each discharge edge and infeed edge with matching center lines is less than or equal to a first tolerance;

calculating a separation height between each discharge edge and infeed edge with the distance separating the discharge edge and the infeed edge less than or equal to the first tolerance with matching center lines;

determining whether the separation height is acceptable;

calculating discharge edge lines and infeed edge lines for each discharge edge and infeed edge with an acceptable separation height;

determining whether the discharge edge lines and infeed edge lines for each discharge and infeed edge with an acceptable separation height are parallel; and identifying each discharge edge and infeed edge with the distance separating the discharge edge and the infeed edge less than or equal to the first tolerance with matching center lines, the acceptable separation height, and parallel discharge edge lines and infeed edge lines as a valid link.

17. The computing device of claim 16, wherein the first tolerance is a quarter of an inch.

18. The computing device of claim 16, wherein the first tolerance is one and a half inches.

19. The computing device of claim 11, wherein the processor is configured with processor-executable instructions to perform operations such that identifying one or more valid links between the pieces of material handling equipment in the listing based at least in part on the infeed and discharge edges comprises:

calculating discharge edge lines and infeed edge lines for any discharge edge and infeed edge not associated with a valid link;

determining whether any discharge edge lines and infeed edge lines are parallel;

calculating a distance separating any discharge edge and infeed edge with parallel discharge edge lines and infeed edge lines;

determining whether the distance separating any parallel discharge edges and infeed edges is less than or equal to a second tolerance;

calculating discharge edge corner lines and infeed edge corner lines for any discharge edge and infeed edge with parallel discharge edges and infeed edges separated by the distance less than or equal to a second tolerance;

determining whether any discharge edge corner line intersects an infeed edge corner line for any discharge edge and infeed edge with parallel discharge edges and infeed edges separated by the distance less than or equal to the second tolerance;

determining whether any infeed edge center line intersects the discharge edge for any parallel discharge edge and infeed edge with the discharge edge corner line intersecting the infeed edge corner line and the discharge edge and infeed edge separated by the distance less than or equal to the second tolerance;

calculating a separation height between each discharge edge and infeed edge with the infeed edge center line intersecting the discharge edge for any parallel discharge edge and infeed edge with the discharge edge corner line intersecting the infeed edge corner line and the discharge edge and infeed edge separated by the distance less than or equal to the second tolerance;

determining whether the separation height is acceptable; and identifying each discharge edge and infeed edge with the infeed edge center line intersecting the discharge edge for any parallel discharge edge and infeed edge with the discharge edge corner line intersecting the infeed edge corner line, the discharge edge and infeed edge separated by the distance less than or equal to the second tolerance, and an acceptable separation height as a valid link.

20. The computing device of claim 19, wherein the second tolerance is one inch.

* * * * *